(12) United States Patent
    Filo

(10) Patent No.: US 11,079,590 B2
(45) Date of Patent: Aug. 3, 2021

(54) MODULATING RETROREFLECTIVE PIEZOELECTRIC MULTILAYER FILM

(71) Applicant: Andrew Simon Filo, Cupertino, CA (US)

(72) Inventor: Andrew Simon Filo, Cupertino, CA (US)

(73) Assignee: Andrew Simon FILO, Cupertino, CA (US)

( * ) Notice: Subject to any disclaimer, the term of this patent is extended or adjusted under 35 U.S.C. 154(b) by 137 days.

(21) Appl. No.: 16/327,932

(22) PCT Filed: Aug. 25, 2017

(86) PCT No.: PCT/US2017/048610
§ 371 (c)(1),
(2) Date: Feb. 25, 2019

(87) PCT Pub. No.: WO2018/039558
PCT Pub. Date: Mar. 1, 2018

(65) Prior Publication Data
US 2019/0187456 A1     Jun. 20, 2019

Related U.S. Application Data

(60) Provisional application No. 62/380,263, filed on Aug. 26, 2016.

(51) Int. Cl.
*G02B 26/00*     (2006.01)
*G02B 26/02*     (2006.01)
(Continued)

(52) U.S. Cl.
CPC .............. *G02B 26/02* (2013.01); *G01S 17/74* (2013.01); *G09F 3/02* (2013.01); *G09F 3/10* (2013.01);
(Continued)

(58) Field of Classification Search
CPC ..................................................... G02B 26/02
(Continued)

(56) References Cited

U.S. PATENT DOCUMENTS 3,924,929 A   12/1975   Holmen et al.
4,193,693 A    3/1980   Schindler
(Continued)

OTHER PUBLICATIONS

International Application No. PCT/US2017/048610, "PCT Written Opinion", dated Jul. 12, 2018, 6 pages.
(Continued)

*Primary Examiner* — James C. Jones
(74) *Attorney, Agent, or Firm* — Cozen O'Connor

(57) ABSTRACT

Provided herein is a modulating retroreflective multilayer film comprising retroreflective elements, a piezoelectric layer, a photovoltaic layer, and an energy storage device. The stacked and transparent layered configuration of the film allows the retroreflective elements and the photovoltaic layer to be simultaneously illuminated by a narrow beam. The low power piezoelectric layer and the energy harvesting of the photovoltaic layer allow the retroreflector to be energetically self-sufficient and suitable for remote deployment. The flexible properties of the component layers allow the retroreflector to be adhered to nonplanar or irregular surfaces for the purpose of labeling and tagging.

17 Claims, 13 Drawing Sheets

(51) Int. Cl.
*G01S 17/74* (2006.01)
*H01L 31/053* (2014.01)
*G09F 3/02* (2006.01)
*G09F 3/10* (2006.01)
*H01L 27/20* (2006.01)
*H01L 41/047* (2006.01)
*H01L 41/09* (2006.01)
*H01L 41/193* (2006.01)
*B64G 1/10* (2006.01)
*B64G 1/66* (2006.01)

(52) U.S. Cl.
CPC ............ *H01L 27/20* (2013.01); *H01L 31/053* (2014.12); *H01L 41/0478* (2013.01); *H01L 41/0926* (2013.01); *H01L 41/193* (2013.01); *B64G 1/1085* (2013.01); *B64G 1/66* (2013.01); *G09F 2003/0257* (2013.01)

(58) Field of Classification Search
USPC .................................................. 359/290, 291
See application file for complete search history.

(56) References Cited

U.S. PATENT DOCUMENTS

| | | | |
|---|---|---|---|
| 4,482,900 A | 11/1984 | Bilek et al. | |
| 5,196,713 A | 3/1993 | Marshall | |
| 5,202,689 A | 4/1993 | Bussard et al. | |
| 5,355,241 A | 10/1994 | Kelley | |
| 5,474,264 A | 12/1995 | Lund et al. | |
| 6,137,623 A | 10/2000 | Roberson et al. | |
| 6,233,088 B1 | 5/2001 | Roberson et al. | |
| 6,507,441 B1 | 1/2003 | Eisenberg et al. | |
| 6,517,923 B1 | 2/2003 | Nakayama et al. | |
| 6,721,539 B1 | 4/2004 | O'brien et al. | |
| 6,784,825 B1 | 8/2004 | Kubota et al. | |
| 6,828,949 B2 | 12/2004 | Harless | |
| 7,190,907 B2 * | 3/2007 | Cicchiello | G01S 7/481 342/45 |
| 7,460,051 B2 | 12/2008 | Nasvall et al. | |
| 7,920,100 B2 | 4/2011 | Brown et al. | |
| 7,929,195 B2 | 4/2011 | Bifano | |
| 7,980,710 B2 | 7/2011 | Hayashi et al. | |
| 9,281,569 B2 | 3/2016 | Taylor et al. | |
| 2013/0202010 A1 | 8/2013 | Cramer et al. | |

OTHER PUBLICATIONS

"International Search Report and Written Opinion" issued in PCT/US2017/048610, dated Nov. 6, 2017, 12 pages.

International Application No. PCT/US2017/048610, "Notification of Transmittal of International Preliminary Report on Patentability", dated Oct. 19, 2018, 18 pages.

* cited by examiner

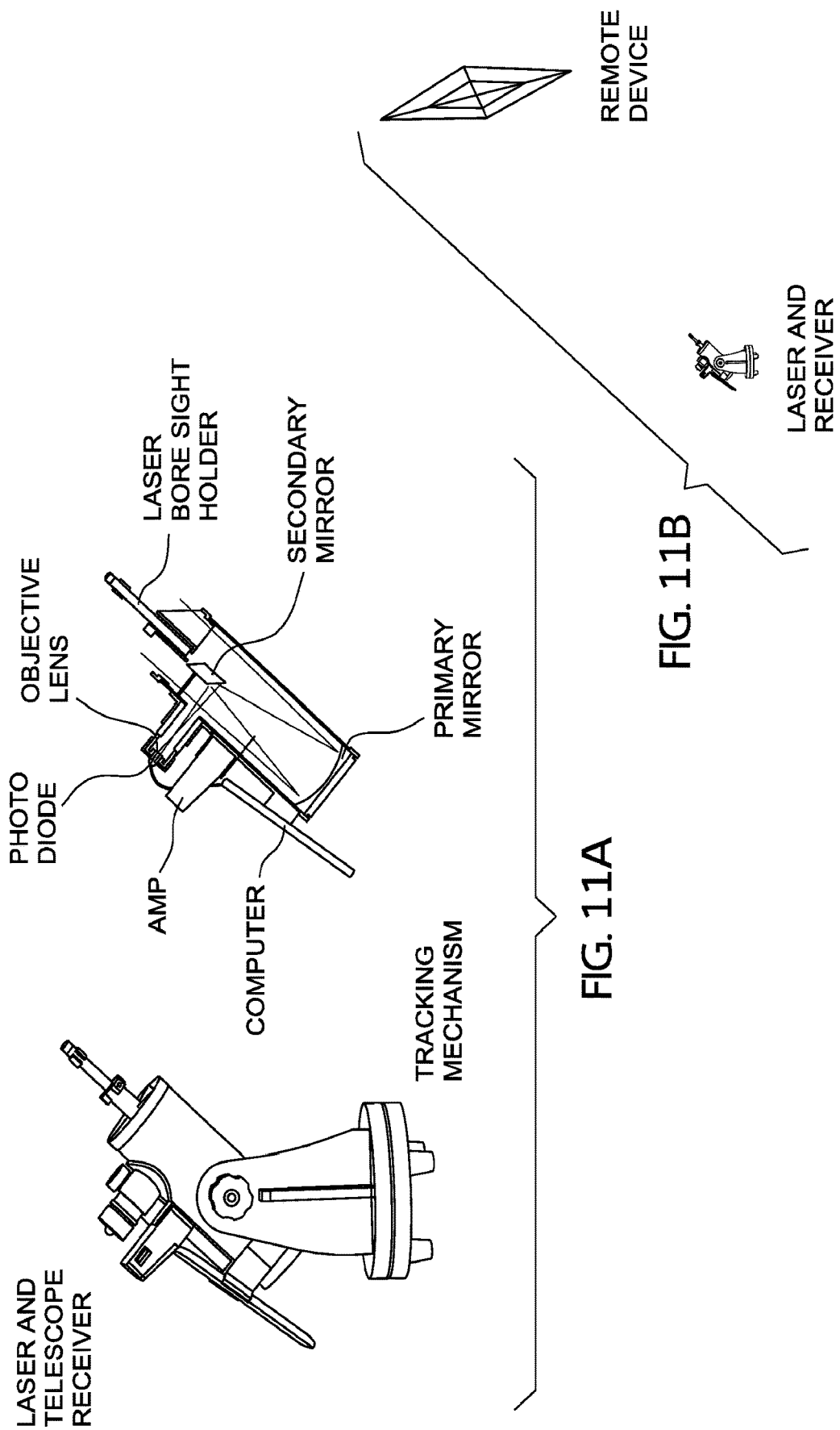

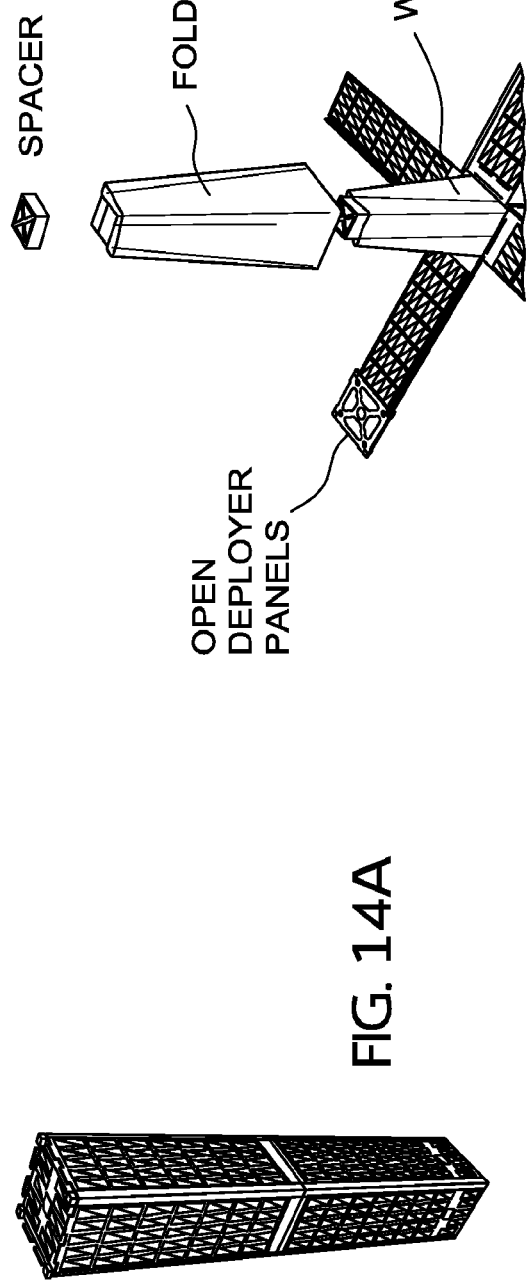
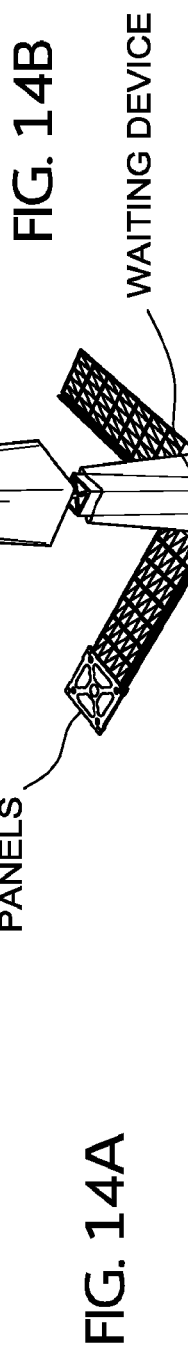
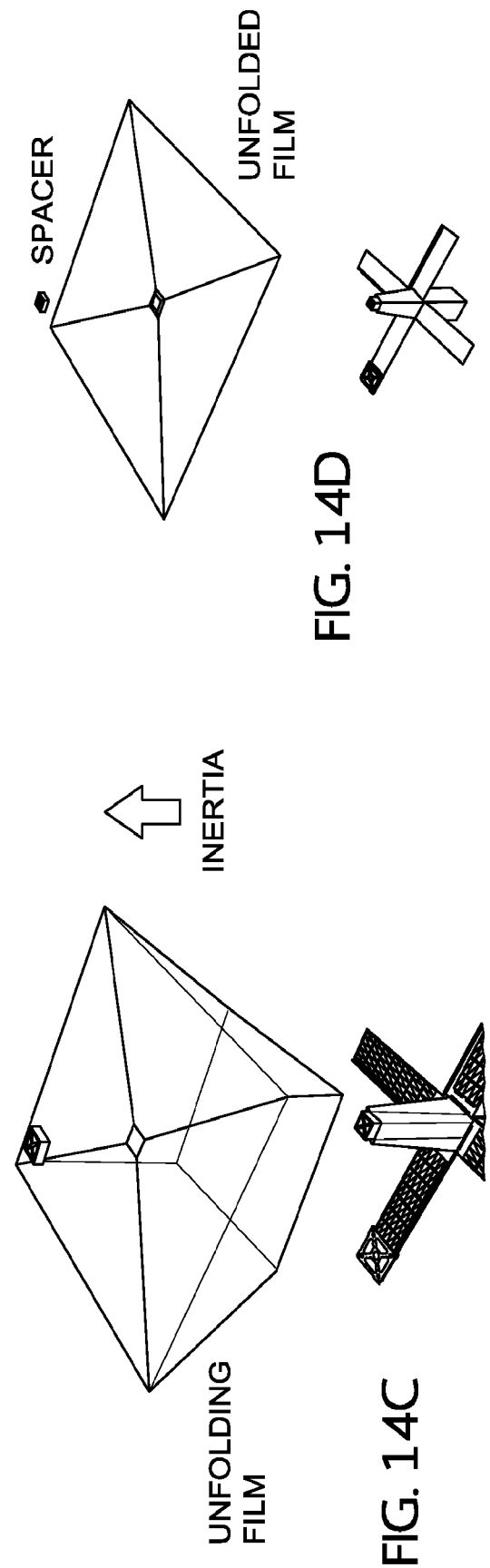
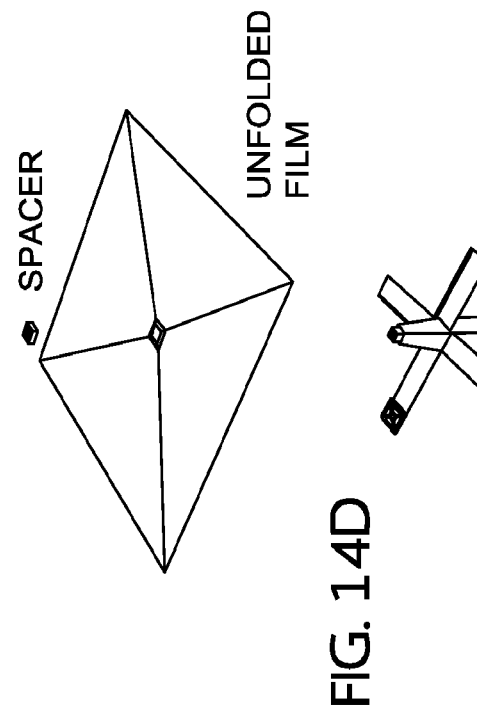
FIG. 14A
FIG. 14B
FIG. 14C
FIG. 14D

MODULATING RETROREFLECTIVE PIEZOELECTRIC MULTILAYER FILM

CROSS REFERENCE TO RELATED APPLICATIONS

This application is a U.S. National Stage of International Application No. PCT/US2017/048610, filed Aug. 25, 2017, which claims the benefit of U.S. Provisional Application No. 62/380,263, filed Aug. 26, 2016, the entire contents of which are incorporated herein by reference.

FIELD OF THE INVENTION

The present invention relates generally to modulating retroreflectors, in particular to modulating retroreflectors in the form of a thin multilayer film including a piezoelectric layer, a photovoltaic layer, an energy storage device, and retroreflective elements.

BACKGROUND OF THE INVENTION

Conventional retroreflectors are fairly well known. In general, retroreflectors have the property of receiving an incident beam, from a source such as an optical or radio frequency (RF) beam, and directing a retroreflected beam back to the source through one or more reflections. Modulating retroreflectors provide the advantage that the retroflected beam contains information and carries the information back to the source without the need for a transmitter at the retroreflection site. Retroreflectors can be arranged in an array to provide a larger target, multiple channels, or other advantages.

These modulating retroreflectors have found a wide variety of applications in numerous fields including communications systems, monitoring systems, and in-flight refueling systems. Examples of different types of retroreflector structures include corner-cube reflectors, horn reflectors, cat's eye retroreflectors, single mirror retroreflectors, parabolic dish reflector, cassegrain reflectors, and parabolic cylinder reflectors.

Some typical retroreflectors are employed in optical communications applications. There retroreflectors are useful for low power communications because of their ability to modulate a high-powered incoming light signal and return a modulated signal containing information directly to the original source. One modulation technique provides multiple amplitude coding to the beam. This technique may be useful in binary encoded communications systems. In these cases, the incident beam is permitted to reflect back to the source or not—depending on a modulation of the retroreflector device. Modulation of the retroreflective device is typically achieved by varying the reflective path in the retroreflector. For example, a reflective surface in the retroreflector is (physically or mechanically) tilted to disrupt retroreflection such that no beam is returned to the emission source.

A number of other modulation techniques are known. One type of modulator uses mechanical displacement of a reflective surface to redirect the reflective beam and uses a micro-electromechanical system (MEMS) to cause tilting of a reflective surface to redirect the reflected beam, thereby defeating or disrupting retroreflection. MEMS technology is useful for low energy, small displacement mechanical activity. Using MEMS technology, a micromechanical reflective surface can be tilted based on a modulating signal to modulate the reflection of the incoming beam to provide amplitude modulation or binary encoding of the returned beam. One drawback of this type of retroreflector arrangement is that a relatively large angular displacement is used to cause the retroreflector to reflect or not reflect the incoming beam. The relatively large angular displacement represents challenges with respect to the device geometry, energy consumed by the device, operation frequency, and other performance criteria. For example, the modulation bandwidth may be limited by the response time of the tilted reflective surface, the limitation being exacerbated by inherent response time delays of the modulation device, such as may be observed with voltage slew notes. These MEMS devices are generally fabricated on a rigid substrate such as silicon, and typically require protection from environmental exposure.

Other types of retroreflective devices that can be modulated include Fabry-Perot devices that operate to transmit or reflect light depending on a configuration of parallel plates arranged at an angle to the incident light beam. However, such a device requires two or more reflective surfaces in conjunction with a retroreflector. Such a configuration can be somewhat complex and have a limited bandwidth due to device response time.

Another type of modulated retroreflector uses an optical shutter across an aperture of a normal retroreflector to permit or prevent transmission of an incident beam or retroreflected light. This type of modulated retroreflector can be somewhat expensive and represents other design challenges due to the absorption of energy when the shutter is in a non-transmissive state. As with other modulated retroreflectors described above, the optical shutter device also can have a limited bandwidth due to device component response times.

One example of a modulated retroreflector is found in U.S. Pat. No. 7,929,195, which describes a deformable reflective surface that may be used with a retroreflector to provide a modulated retroreflector. The modulated retroreflector may be used in communication systems such as optical laser communication systems wherein an incident beam is reflected back to the source, as modulated by the modulated retroreflector. The deformable reflective surface uniformly reflects or disperses an incident light, depending on a deformation state of the surface. The different states of the deformable reflective surface permit modulation of the reflected beam, based on an input modulation signal that can contain voice or sensor data, for example. A sensor may be used to sense the incident beam and activate the retroreflector. The deformable reflective surface may be arranged to be switched between a diffractive reflective surface and a uniform reflective surface.

In other applications, retroreflectors (and films that contain retroreflectors) may be employed in optical tags. Tagging technology provides a means to covertly but unambiguously mark a target or location so that it may be identified from a distance with a specialized sensor. The use of a tag greatly eases or eliminates target detection, identification, and discriminating problems. For example, in military applications such as a precision strike application, a tag is applied to a vehicle or location in advance of the strike and a sensor (possibly organic to the strike weapon) uses the tag to simplify the process of finding and identifying the target. This allows for an autonomous terminal engagement even with initial uncertainty in the target location. However, many tagging devices depend on omni-directional RF signals that can be intercepted or jammed. In view of this problem, other tagging devices that rely on laser-based free-space-optical (FSO) communication have also been proposed. Exemplary devices include ferroelectric liquid crystal modulators, micro-electromechanical (MEM) based corner cube retroreflectors, multiple quantum well retroreflectors, and thin-film diffractive modulating retroreflectors.

An example of a modulating retroreflector can be found in U.S. Pat. No. 7,190,907, which describes an optical tag having a photo-detector, a controller, a piezoelectric translator, a battery and a retroreflective tape. The photo-detector is responsive to an optical energy at a predetermined wavelength, and the controller is connected to the output of the photo-detector. The piezoelectric translator connected to controller is also connected to the battery when the photo-detector responds to the optical energy. The retroreflective tape is directly mounted on the piezoelectric translator. When the connection between the piezoelectric translator and the battery is established, a pulse is generated and applied to the retroreflective tape. Therefore, the optical energy incident on the retroreflective tape is modulated by the pulse and retroreflected by the retroreflective tape.

Additional exemplary modulating retroreflector technologies are also disclosed in U.S. Pat. Nos. 6,137,623; 5,355,241; 5,196,713; and 4,193,693. All of the references discussed herein are hereby incorporated by reference.

Even in view of the known technology, the need exists for modulating retroreflectors that have a compact, robust, and simple construction, the ability to harvest and store their own power, and a thin and flexible structure permitting them to be applied to a wide variety of surfaces.

SUMMARY OF THE INVENTION

In one embodiment, the invention is to a modulating retroreflective multilayer film. The multilayer film comprises a piezoelectric layer. Preferably, the piezoelectric layer comprises polyvinylidene fluoride (PVDF). The multilayer film further comprises a plurality of retroreflective elements. Preferably, the retroreflective elements are disposed on a surface of the piezoelectric layer. The multilayer film further comprises a first and a second electrode layer, each in electrical connection with an opposing surface of the piezoelectric layer. Preferably, at least a portion of the first and second electrode layers is transparent. The multilayer film further comprises a voltage source and a processor communicably coupled with one another. The voltage source and the processor are preferably each independently located within a layer of the multilayer film. The multilayer film further comprises an energy storage device located within a layer of the multilayer film and configured to store energy that can be used to apply voltage across the piezoelectric layer or to supply power to the processor. Preferably, the energy storage device comprises one or more batteries or capacitors. The multilayer film further comprises a photovoltaic layer communicably coupled with the processor to transmit electrical signals to the processor. Preferably, the photovoltaic layer is in electrical connection with the energy storage device, and is configured to harvest energy to be stored with the energy storage device.

In another embodiment, the invention relates to a label. The label comprises the multilayer film, wherein the multilayer film comprises an outer adhesive layer located at an end of the multilayer film.

In another embodiment, the invention relates to a labeled article. The labeled article comprises an article comprising an exposed surface. The labeled article further comprises a label, wherein the label is adhered to the exposed surface of the article.

In another embodiment, the invention relates to a miniature spacecraft. The miniature spacecraft comprises the multilayer film. The miniature spacecraft further comprises two or more polymer tubes located within one or more layers of the multilayer film. Preferably, the two or more polymer tubes comprise PVDF or poly(4,4'-oxydiphenylene-pyromellitimide). The miniature spacecraft further comprises one or more shape-memory alloy wires located within one or more layers of the multilayer film, wherein each of the one or more shape-memory alloy wires is connected to two or more of the polymer tubes. Preferably, the one or more shape-memory alloy wires comprise nickel titanium.

In another embodiment the invention relates to a method for modulating retroreflected light. The method comprises providing the multilayer film. The method further comprises illuminating the film with an incident light beam. The method further comprises retroreflecting the incident light beam into a reflected light beam with the retroreflective elements in a first configuration. The method further comprises detecting the incident light beam with the photovoltaic layer. The method further comprises transmitting a signal from the photovoltaic layer to the processor. The method further comprises applying a voltage across the piezoelectric layer, thereby causing a length of the piezoelectric layer to change, and thereby causing at least a portion of the plurality of retroreflective elements to be disposed in a second configuration. The method further comprises retroreflecting the incident light beam into a modulated light beam with the retroreflective elements in the second configuration.

In another embodiment, the invention relates to a method of applying a label to an article. The method comprises providing an article comprising an exposed surface. The method further comprises providing a label. The method further comprises adhering the label to the exposed surface of the article, thereby applying the label to the article.

BRIEF DESCRIPTION OF DRAWINGS

The invention is described in detail below with reference to the appended drawings, wherein like numerals designate similar parts.

FIG. 11A illustrates the construction of a ground or base station used to locate, track, and provide propulsion for a miniaturized spacecraft according to an embodiment.

FIG. 11B presents an environmental view of the ground station and miniaturized spacecraft of FIG. 11A.

FIG. 14A illustrates a closed configuration of a host deployment craft for storing and launching multiple miniaturized spacecraft in accordance with an embodiment.

FIG. 14B illustrates an open configuration of the host deployment craft of FIG. 14B.

FIG. 14C illustrates the launch of a folded miniaturized spacecraft from the host deployment craft of FIG. 14A.

FIG. 14D illustrates the unfolded configuration of the launched miniaturized spacecraft of FIG. 14C.

DETAILED DESCRIPTION OF THE INVENTION

Figure 1:
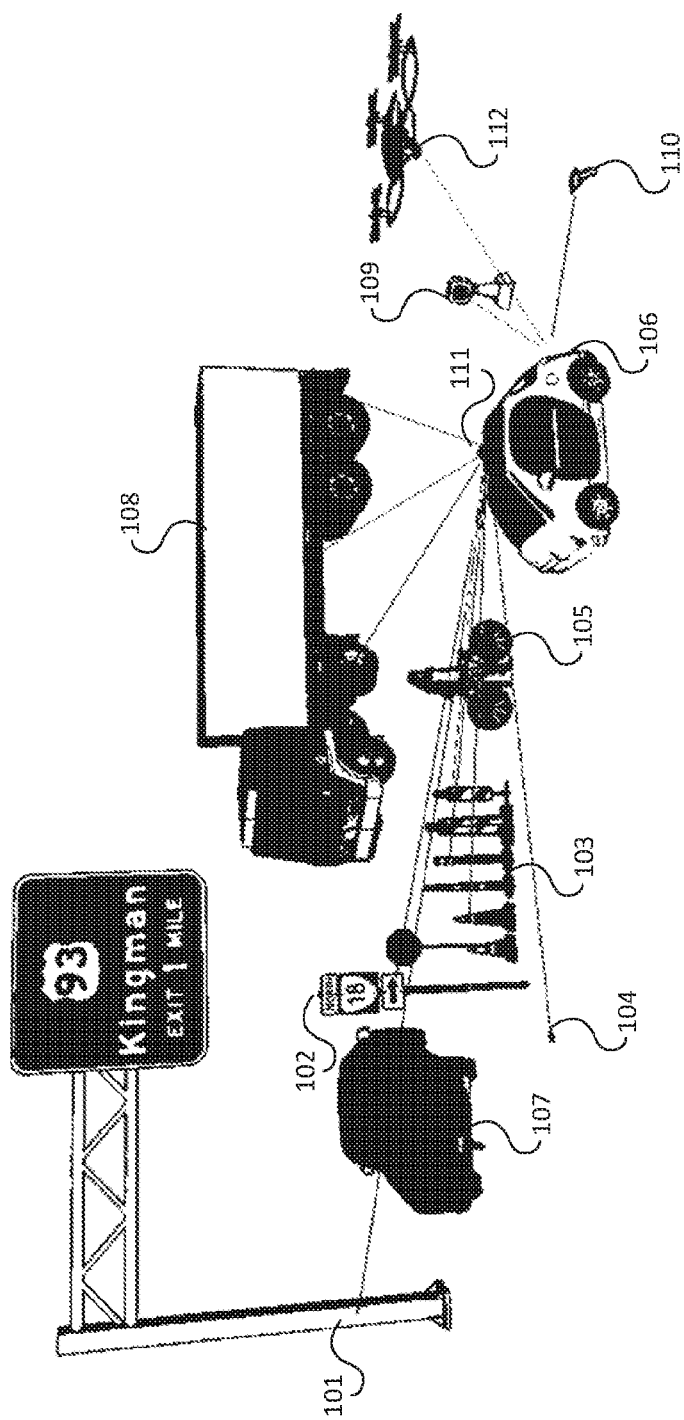
FIG. 1 illustrates various applications of the provided modulating retroreflective piezoelectric multilayer films.

The present invention generally relates to multilayer films that can operate as modulating retroreflectors. These modulating retroreflector multilayer films provide advantageous combinations of high performance characteristics, low energy requirements, film flexibility, and simplified construction. For example, it is beneficial for modulating retroreflectors to be flexible and self-powering so they can be deployed on irregular surfaces or in remote locations, to have high tolerances of physical damage or narrow illuminating beam geometries, and to be simple and inexpensive to mass produce. It has been difficult, however, to achieve these properties with existing designs of modulating retroreflectors as discussed below Most conventional modulating retroreflector devices configure their components adjacent to one another, and not in a stacked manner. That is to say, the retroreflective elements, the actuator or modulator, the electrodes and other electronics, and the photosensor of these conventional retroreflectors are not substantially coextensive with one another. In part due to this adjacent configuration, it can be difficult for a narrow beam to simultaneously illuminate, for example, both the photosensor and the retroreflective elements of the retroreflector. Because, during communication operations, the photosensor is used to receive signals and the retroreflective elements are used to transmit signals, the exclusive illumination of only one of these elements at a time by a narrow beam therefore results in ineffective communication.

As an example, a modulating retroreflector can be used as in a tag assembly to be illuminated by an interrogation laser. Often, the interrogation laser and/or the targeted modulated retroreflector tag assembly are in motion. For example, if the tags are used to track and query multiple containers with a laser light beam emitted from a hand held scanner, then a natural tremble of the operator's hand can cause the alignment of the beam with different elements of the individual tag to be transitory. This transience can establish a critical loitering time during which both the receiver and the modulating retroreflector elements must simultaneously be illuminated to perform communications that are secure and error free. Such problems can be magnified in applications in which the tag is located on a moving airborne, seaborne, or space borne vehicular platform. Furthermore, in some applications a mission critical illumination time can last for only a fraction of a second. In these cases, any temporal or spatial blind spots created by a lack of complete coverage of the different elements of the modulating retroreflector can severely compromise effective communications.

Conventional modulating retroreflector devices, films, and compositions also suffer from the inability to harvest energy, e.g., energy stored in an energy storage device and used to power the actuator/modulator and the processor of the retroreflector. For example, many conventional retroreflector devices are designed for the temporary tagging of vehicles, personnel, structures, or locations, and do not focus on long-term labeling applications. As such, these conventional devices typically are powered by batteries having useful charge lifetimes measured in the tens or hundreds of hours. Accordingly, the conventional devices do not have the need for, nor do they address, the harvesting and storage of energy.

Some conventional modulating retroreflector devices employ a shutter positioned to permit or block light that illuminates the retroreflective elements and is retroreflected back to its source. For example, liquid crystal glass shutter can be placed in front of a traditional retroreflective film or device. These shutters are typically rigid structures, however, that cannot be easily conformed to nonplanar surfaces. Also, the opening and closing of the shutters is a relatively energy intensive process, often requiring electrical potentials on the order of 50-100 V.

Some conventional retroreflector devices do not utilize configurations in which the retroreflective elements are in contact with, or coextensive with, the actuator or modulator. For example, some conventional devices utilize a modulation control system in which actuators are in contact with deformable layers instead of the retroreflective layer or elements. With such devices, the actuator deforms the deformable layer to indirectly induce the modulation of retroreflected light. Such configurations can create production complexity problems and high fabrication cost, and also can suffer from slow switching speeds that can translate to low communication throughput and efficiency.

The inventors have now discovered that the use of specific thin layers of particular flexible films that include a piezoelectric material and a photovoltaic system (preferably including an energy storage device) produces a modulating retroreflector that provides high performance characteristics, film flexibility, and simplified construction, while maintaining low energy requirements and the ability to harvest energy. The multilayer film design allows for illumination of the retroreflective elements and the photosensor (e.g., the photovoltaic layer) simultaneously, even with the use of a narrow beam directed towards the retroreflective elements alone. Also, by creating the multiple layers of the film of thin and flexible material, the modulating retroreflector can be readily applied to nonplanar or irregular surfaces, such as cylindrical surfaces, spherical surfaces, angular surfaces, or surfaces that include screw or nail heads, bumps, or depressions. Because the piezoelectric layer requires very low energy to modulate the retroreflective elements, and the photovoltaic layer can be used as an energy supplier (from which energy can be harvested), the multilayer film retroreflector can operate independently for long periods of time, and can be deployed in remote locations that include those underwater or in space. Another advantage of the provided multilayer film is that the elements have a high degree of off axis compliance, meaning that they can be folded, wrapped, or wrinkled and still efficiently perform their tasks of reflection and modulation.

In some embodiments, the use of specific materials, e.g., a transparent polymer, in the piezoelectric material and the retroreflective elements, advantageously allows light to pass through these upper components to a photovoltaic layer located beneath them. The photovoltaic layer can both sense an illumination light beam, e.g., interrogation from a laser, and harvest energy from light having appropriate wavelengths, e.g., ambient sunlight or other ambient light. Furthermore, because the photovoltaic layer, the piezoelectric layer, and the retroreflective elements are present in a stacked configuration within a multilayer film, the photovoltaic layer is capable of (and is not prevented from) communicating with, or converting energy from, any radiation impinging on the external upper surface of the multilayer film. This harvested or converted energy, beneficially, can be used directly, or can be stored in one or more energy storage devices within the multilayer film, to extend the useful lifetime of the retroreflector, or to provide power on demand to the retroreflector electronic components.

Another advantage of the layered construction of the provided modulating retroreflectors is that the components of the retroreflector can be present in a sealed configuration that is void of internal cavities. This can allow the multilayer film retroreflectors to be particularly well suited for use in extreme environments ranging from deep sea submersion to the vacuum of space without the need for enclosures or protective optical windows. The layered and optionally caseless construction of the multilayer films also allows them to be used as lightweight labels or tags that can be easily mounted with a pressure sensitive adhesive. Such labels can be produced through large-scale lamination, rolling, and/or cutting procedures commonly used in multilayer label or adhesive production and well known to those of skill in the art.

FIG. 1 illustrates various applications of the provided modulating retroreflective piezoelectric multilayer film in the field of ground transportation monitoring and control. Shown in FIG. 1 are several road and traffic surfaces, each of which can be labeled with an adhesive label or enclosed tag that incorporates the provided multilayer film. For example, modulating retroreflective labels can be affixed to stationary surfaces such as traffic signs 101 and 102, road construction markers 103, or lane designation markers 104. Modulating retroreflective labels can be affixed to moving surfaces including bicycles 105, passenger motor vehicles such as cars 106 and passenger trucks 107, and commercial motor vehicles such as commercial trucks 108. The labels can be illuminated, scanned, or interrogated with, for example, lasers emitted from stationary roadside laser emitters 109, handheld laser emitters 110, or laser emitters mounted on ground vehicles such as cars 111, or aerial vehicles such as drones 112.

Modulating retroreflective multilayer films, methods for modulating retroreflected light, as well as many applications for the films and methods are described herein. Some embodiments relate to a modulating retroreflective multilayer film comprising (a plurality of) retroreflective elements; a piezoelectric layer having opposing top and bottom surfaces; a first electrode layer in electrical connection with the top surface of the piezoelectric layer; a second electrode layer in electrical connection with the bottom surface of the piezoelectric layer; a voltage source located within a layer of the multilayer film; a processor located within a layer of the multilayer film; an energy storage device located within a layer of the multilayer film; and a photovoltaic layer communicably in electrical connection with the energy storage device and coupled with the processor. The voltage source is in electrical connection with the first and second electrode layers and the processor is coupled to the voltage source, which provides the ability to apply a voltage across the piezoelectric layer. The energy storage device is configured to store energy used for the application of the voltage across the piezoelectric layer. The photovoltaic layer is communicably coupled with the processor to transmit electrical signals to the processor.

Figure 2:
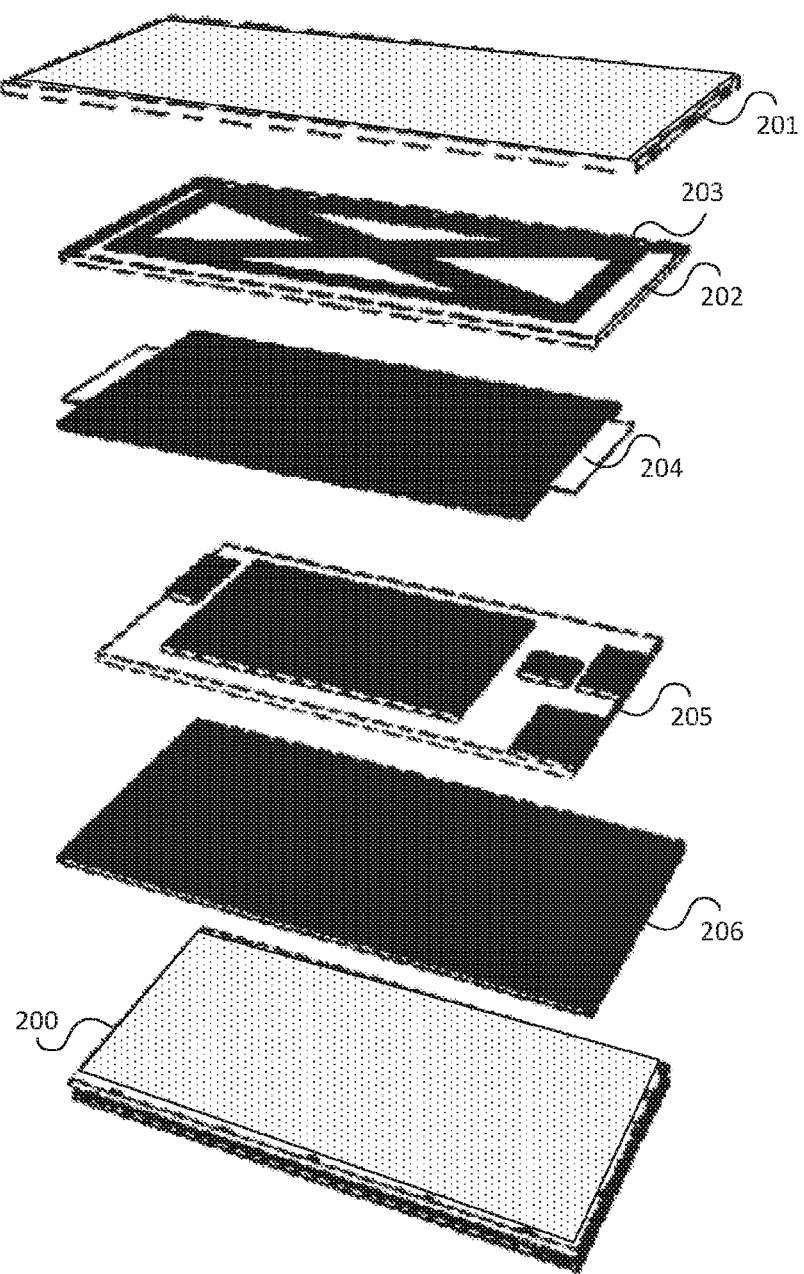
FIG. 2 presents an exploded view of a modulating retroreflective multilayer film in accordance with an embodiment.

FIG. 2 illustrates an exploded view of multilayer film 200 in accordance with one embodiment. The top layer of the exploded view is a retroreflective layer 201. In addition to comprising a plurality of retroreflective elements, the retroreflective layer can also include visual references, such as text or images, in the form of, for example, printed indicia or embossed markings. Beneath the retroreflective layer is a piezoelectric layer 202. The piezoelectric layer can serve as a modulator or actuator of the retroreflective elements of the retroreflective layer. The upper and lower surfaces of the piezoelectric layer are in electrical connection with a pair of electrodes 203 that can each be in a separate electrode layer, e.g., a first and a second electrode layer. The electrodes can be used to apply a voltage across the piezoelectric layer, causing the length of the piezoelectric layer to change, and the configuration of the retroreflective elements of the retroreflective layer to modulate, as discussed in more detail below. Beneath the piezoelectric layer is a photovoltaic layer 204. The photovoltaic layer can act both to sense or detect interrogating or communicating illumination, and to harvest energy from ambient radiation and convert it to electricity. The electricity generated by the photovoltaic layer can be directed to the electrodes or to one or more components of the electronics layer 205. The electronics layer can comprise several components useful in the electronic operation of the multilayer film. These components can include, for example, a driver or other voltage source used to apply the voltage across the piezoelectric layer with the electrodes; a processor used to communicate with one or more of the voltage source, the electrodes, or the photovoltaic layer; and/or one or more energy storage devices used to store energy delivered from the photovoltaic layer and/or to deliver energy to one or more of the processor, the voltage source, or the electrodes. The bottom layer of the multilayer film of FIG. 2 is an adhesive layer 206. The inclusion of such an adhesive layer is particularly useful in embodiments in which the multilayer film is intended to be mounted to an exposed surface as a modulating retroreflecting label.

The configuration of the layers as shown in FIG. 2 represents only one embodiment of the provided multilayer films, and other configurations are possible. In addition, other layers, components, and elements can be added to the multilayer film without impacting its beneficial performance characteristics. In general, the only requirements for configuring the different layers and components of the multilayer film are that illumination light can reach or penetrate to the retroreflective elements and the photovoltaic layer, and that the piezoelectric layer can suitably modulate the positioning of the retroreflective elements.

The positioning of the retroreflective elements can vary widely. In some cases, the retroreflective elements are disposed on the piezoelectric layer, e.g., on the top surface and/or the bottom surface of the piezoelectric layer. Preferably, the retroreflective elements are disposed on the bottom surface of the piezoelectric layer. In some cases, the retroreflective elements can be formed into or on the piezoelectric layer. For example, the retroreflective elements can be embossed on the piezoelectric layer. In other cases, the retroreflective elements can be a part of a retroreflective layer, wherein the retroreflective elements are disposed on a surface of the retroreflective layer. The retroreflective layer can comprise a base layer with at least some retroreflective elements disposed on or in it. In some embodiments, the retroreflective layer is a retroreflective tape product. The retroreflective layer can be configured on the piezoelectric layer. In another embodiment, the retroreflective elements are coated onto the piezoelectric layer and/or optionally onto other layer(s). Combinations of these configurations are contemplated as well. The arrangement of the retroreflective elements is discussed in more detail below.

In some embodiments, the retroreflective layer and the photovoltaic layer are at least substantially coextensive with one another. In some embodiments, the retroreflective layer and an electronics layer are substantially coextensive with another, wherein the electronics layer includes one or more of a voltage source used to apply the voltage across the piezoelectric layer with the electrodes; a processor used to communicate with one or more of the voltage source, the electrodes, or the photovoltaic layer; and/or one or more energy storage devices used to store energy delivered from the photovoltaic layer and/or to deliver energy to one or more of the processor, the voltage source, or the electrodes. In some embodiments, the retroreflective layer, the piezoelectric layer, the first electrode layer, the second electrode layer, and the photovoltaic layer are at least substantially coextensive with one another. In some embodiments, all layers of the multilayer film are substantially coextensive with one another. In some embodiments, some of the layers of the multilayer film are substantially coextensive with one another and some are not. The coextensive configuration of the various layers beneficially provides for simultaneous illumination of components, e.g., the retroreflective elements and the photosensor, e.g., the photovoltaic layer, even with the use of a narrow beam directed towards the retroreflective elements alone. Without such configuration, much broader beams or multiple beams are necessary to illuminate all of the components, which results in slow and ineffective communication.

As used herein, the term "substantially coextensive" refers to a relationship between two or more layers such that the surface areas of adjacent or parallel faces of the layers are within 80% of one another. For example, two or more layers are substantially coextensive if the surface areas of adjacent or parallel faces of the layers are within 80%, within 82%, within 84%, within 86%, within 88%, within 90%, within 92%, within 94%, within 96%, or within 98% of one another. The term "substantially coextensive" can also refer to a relationship between two or more layers such that the lengths of the layers are within 80% of one another. For example, two or more layers are substantially coextensive if the lengths of the layers are within 80%, within 82%, within 84%, within 86%, within 88%, within 90%, within 92%, within 94%, within 96%, or within 98% of one another. The term "substantially coextensive" can also refer to a relationship between two or more layers such that the widths of the layers are within 80% of one another. For example, two or more layers are substantially coextensive if the widths of the layers are within 80%, within 82%, within 84%, within 86%, within 88%, within 90%, within 92%, within 94%, within 96%, or within 98% of one another.

Figure 3:
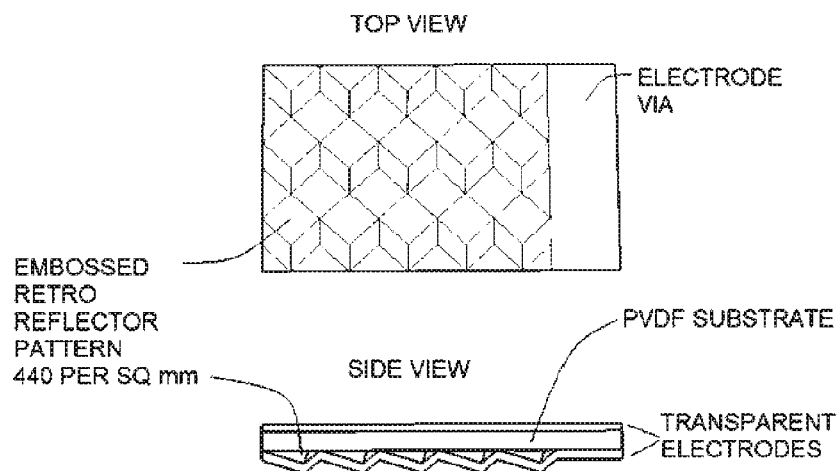
FIG. 3 presents a top view and a side view of selected layers of a modulating retroreflective multilayer film in accordance with an embodiment in which the retroreflective elements are disposed on a surface of the piezoelectric layer.

FIG. 3 presents a top view and a side view of a modulating retroreflective multilayer film in which the retroreflective elements are disposed on a surface of the piezoelectric layer. By combining the retroreflective elements and the piezoelectric material within the same monolithic layer, the construction of the multilayer film can be simplified, the thickness of the film can be reduced, and the ability of the electrical stimulation of the piezoelectric material to influence the positioning of the retroreflective elements is increased. As shown in FIG. 3, a pattern of retroreflective elements can be embossed at a high density on a surface of, for example, a PVDF substrate serving as the piezoelectric layer. The upper and lower surfaces of the piezoelectric layer are directly adjacent to a first and a second electrode layer. At least a portion of the electrode layers and the piezoelectric layer are transparent, allowing light to penetrate to one or more lower layers (not shown) of the multilayer film, including a photovoltaic layer.

Figure 4:
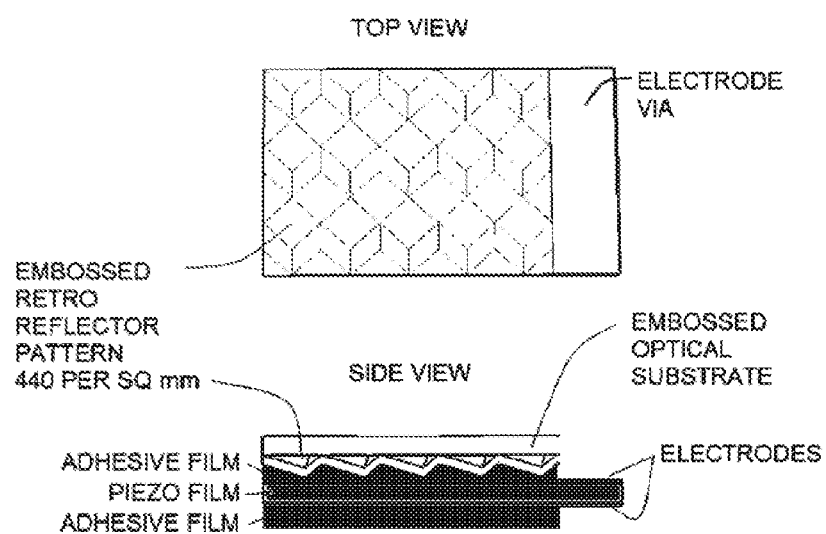
FIG. 4 presents a top view and a side view of selected layers of a modulating retroreflective multilayer film in accordance with an embodiment in which the retroreflective elements are disposed on a surface of a retroreflective layer that is separate from the piezoelectric layer.

FIG. 4 presents a top view and a side view of a modulating retroreflective multilayer film in which the retroreflective elements are disposed on a retroreflective surface of an optical substrate (e.g., a retroreflective layer) that is separate from the piezoelectric layer. As shown in FIG. 4, the upper and lower surfaces of the piezoelectric layer are directly adjacent to a first and a second electrode layer. Two adhesive layers are also shown in the multilayer film of FIG. 4. The first of these adhesive layers joins the upper electrode layer to the retroreflective layer above. The second of these adhesive layers can join the lower electrode layer to lower layers (not shown) of the multilayer film, including a photovoltaic layer. At least a portion of the retroreflective layer, the electrode layers, the piezoelectric layer, and the adhesive layers are transparent, allowing light to penetrate to one or more of these lower layers. This multilayer film construction of FIG. 4 has particular use in applications for which higher durability is required. For example, if a modulating retroreflective device is intended to be potentially exposed to salt water, airborne abrasive, or seasonal weather, then the retroreflector layer can comprise a thicker, harder, or denser material, such as for example, high density acrylic, to better survive those environments.

Figure 5:
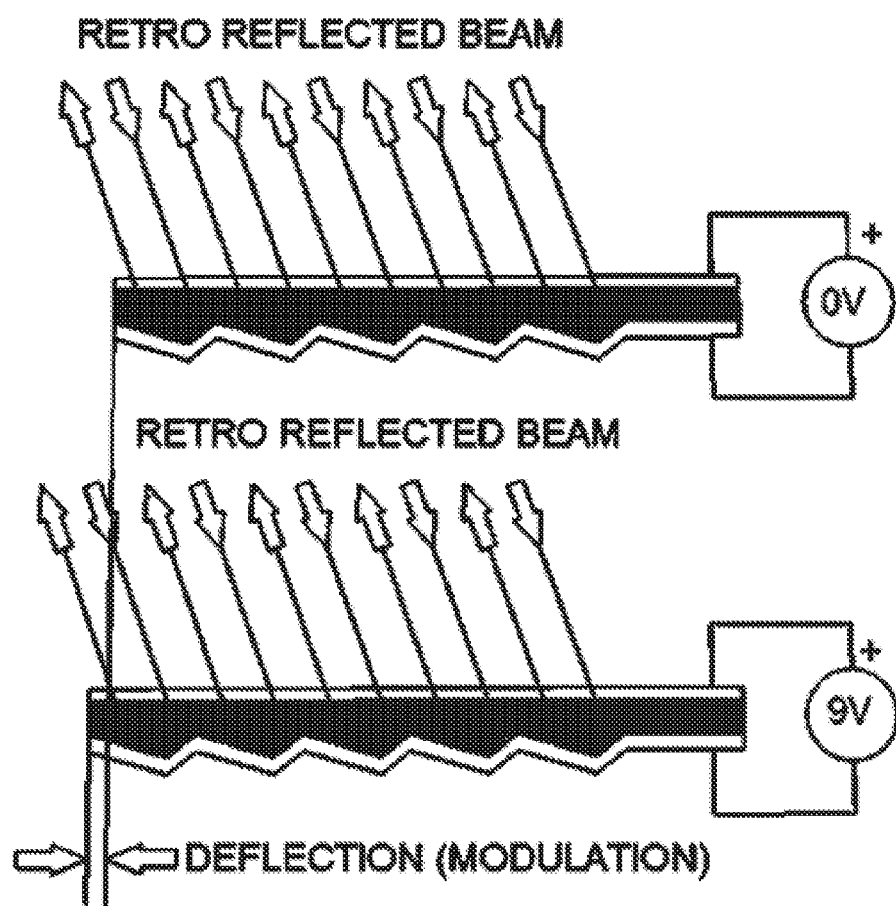
FIG. 5 present side views of selected layers of a modulating retroreflective multilayer film in accordance with an embodiment, illustrating the modulation effects of applying a voltage across the piezoelectric layer.

FIG. 5 illustrates the modulation effects of applying a voltage across a piezoelectric layer of a modulating retroreflective multilayer film. The multilayer film of FIG. 5 includes a piezoelectric layer that comprises the retroreflective elements of the film, and is in contact with a first and a second electrode layer. The electrode layers are in electrical connection with a voltage source. As shown in FIG. 5, modulation occurs when a low voltage, typically around 9 V, is applied across the piezoelectric layer using the electrodes. The application of the voltage causes a lateral length change in the piezoelectric layer that shifts the configuration of the retroreflective elements, and modulates the incoming beam of light. The modulation happens along the poled axis of the piezoelectric material, wherein the voltage changes the physical length of the layer. This can, for example, result in a disruption of a laser light wave front impinging on the retroreflective elements. To achieve a higher modulation, the piezoelectric material can be orientated to take advantage of the modulation axis, or the retroreflective elements can be orientated to form a radial pattern. The result of the electrical stimulation of the piezoelectric layer is a true analog variable modulation, with a response time that can be suitable for digital modulation as well.

Although the retroreflective elements shown in FIGS. 3-5 are disposed on lower surfaces (i.e., surfaces facing away from incident radiation) of their respective layers, it is appreciated that in some embodiments the retroreflective elements can alternatively be disposed on upper surfaces (i.e., surfaces facing towards incident radiation), or both upper and lower surfaces.

In some embodiments, (at least a portion of) the retroreflective layer, the piezoelectric layer, the first electrode layer, and/or the second electrode layer is transparent. As used herein, the term "transparent" refers to a material or layer that permits radiation of a wavelength of interest to pass therethrough. The wavelength of interest is typically a wavelength to be retroreflected by the retroreflective elements, or to be detected or harvested by the photovoltaic layer. The wavelength of interest can be a component of the visible light spectrum, or can be an invisible wavelength. The wavelength of interest can be associated with, for example, infrared radiation, microwave radiation, radio wave radiation, ultraviolet radiation, or X-ray radiation. In some embodiments, the portion of the retroreflective layer, the piezoelectric layer, the first electrode layer, and the second electrode layer that is transparent is at least 5%, at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, at least 85%, at least 90%, or at least 95%. By utilizing such materials, light is advantageously allowed to pass through these components to the photovoltaic layer that may be located beneath them, thus allowing the photovoltaic layer to both sense an illumination light beam, e.g., interrogation from a laser, and harvest energy from light having appropriate wavelengths, e.g., ambient sunlight or other ambient light.

Because of the use of specific thin layers of particular flexible films, the retroreflective multilayer film beneficially has a high degree of flexibility. In particular, the piezoelectric material of the piezoelectric layer can be selected so as to give the multilayer film sufficient flexibility allowing it to conform to nonplanar or rough surfaces to which it is adhered. The flexibility of the film can be measured, for example, in terms of durometer hardness according to the standard protocol ASTM 2240 using scale A (2017). In some embodiments the multilayer film has a durometer hardness ranging from 10 to 100, e.g., from 10 to 60, from 20 to 70, from 30 to 80, from 40 to 90, or from 50 to 100. In terms of upper limits, the durometer hardness of the multilayer film can be less than 100, e.g., less than 90, less than 80, less than 70, less than 60, less than 50, less than 40, less than 30, or less than 20. In terms of lower limits, the durometer hardness of the multilayer film can be greater than 10, e.g., greater than 20, greater than 30, greater than 40, greater than 50, greater than 60, greater than 70, greater than 80, or greater than 90. The flexibility of the film can alternatively be measured in terms of flexural strength according to the standard protocol ASTM D790 (2017). In some embodiments, the multilayer film has a flexural strength ranging from 500 psi to 20,000 psi, e.g., from 500 psi to 12,000 psi, from 2500 psi to 14,000 psi, from 4500 psi to 16,000 psi, from 6500 psi to 18,000 psi, or from 8500 psi to 20,000 psi. In terms of upper limits, the flexural strength of the multilayer film can be less than 20,000 psi, less than 18,000 psi, less than 16,000 psi, less than 14,000 psi, less than 12,000 psi, less than 10,000 psi, less than 8000 psi, less than 6000 psi, less than 4000 psi, or less than 2000 psi. In terms of lower limits, the flexural strength of the multilayer film can be greater than 500 psi, greater than 2500 psi, greater than 4500 psi, greater than 6500 psi, greater than 8500 psi, greater than 10,500 psi, greater than 12,500 psi, greater than 14,500 psi, greater than 16,500 psi, or greater than 18,500 psi.

The thickness of the retroreflective multilayer film may vary. In some embodiments, the retroreflective multilayer film is a thin film. The use of the use of specific thin layers provides for advantageous combinations of flexibility, integrity, and performance. The components (and the overall thickness) of the multilayer film can be selected based on several factors, such as the desired flexibility and integrity needed for a particular application, or the particular wavelength of radiation to be retroreflected. It has been discovered that the shorter the desired wavelength is, the smaller the structure can be, and the thinner the multilayer film can be. The illuminating frequencies useful for a particular application can be determined in part by the nature of the medium (e.g., air, water, or a vacuum) the device is operating in, and the absorption properties of that medium. In some embodiments, the multilayer film has a thickness ranging from 1 micron to 100 microns. The multilayer film thickness can, for example, range from 1 micron to 60 microns, from 10 microns to 70 microns, from 20 microns to 80 microns, from 30 microns to 90 microns, or from 40 microns to 100 microns. In terms of upper limits, the multilayer film thickness can be less than 100 microns, e.g., less than 90 microns, less than 80 microns, less than 70 microns, less than 60 microns, less than 50 microns, less than 40 microns, less than 30 microns, less than 20 microns, or less than 10 microns. In terms of lower limits, the multilayer film thickness can be greater than 1 micron, e.g., greater than 10 microns, greater than 20 microns, greater than 30 microns, greater than 40 microns, greater than 50 microns, greater than 60 microns, greater than 70 microns, greater than 80 microns, or greater than 90 microns.

In some embodiments, the plurality of retroreflective elements comprises microprism retroreflectors. The microprisms can be, for example, cube corner reflectors. In some embodiments, the plurality of retroreflective elements comprises holographic retroreflectors. In some embodiments, the plurality of retroreflective elements comprises glass beads. In some embodiments, the plurality of retroreflective elements comprises encapsulated lenses. The retroreflective elements can also include, without limitation, horn reflectors, cat's eye retroreflectors, single mirror retroreflectors, parabolic dish reflectors, cassegrain reflectors, and parabolic cylinder reflectors.

One advantage of the provided modulating retroreflective multilayer film is that the plurality of retroreflective elements can be arrayed in a highly dense and redundant arrangement. This configuration can allow the multilayer film to be highly impervious to damage. For example, if one or more portions of the film become damaged, the number and density of retroreflector elements in other undamaged portions can allow the modulating retroreflector to continue to operate. The plurality of retroreflective elements can be disposed on a retroreflective surface of the modulating retroreflective multilayer film at a density ranging from, for example, 10 per square millimeter to 1000 per square millimeter, e.g., from 10 per square millimeter to 600 per square millimeter, from 100 per square millimeter to 700 per square millimeter, from 200 per square millimeter to 800 per square millimeter, from 300 per square millimeter to 900 per square millimeter, or from 400 per square millimeter to 1000 per square millimeter. In terms of upper limits, the retroreflective elements can be disposed on a retroreflective surface of the film at a density less than 1000 per square millimeter, e.g., less than 900 per square millimeter, less than 800 per square millimeter, less than 700 per square millimeter, less than 600 per square millimeter, less than 500 per square millimeter, less than 400 per square millimeter, less than 300 per square millimeter, less than 200 per square millimeter, or less than 100 per square millimeter. In terms of lower limits, the retroreflective elements can be disposed on a retroreflective surface of the film at a density greater than 10 per square millimeter, e.g., greater than 100 per square millimeter, greater than 200 per square millimeter, greater than 300 per square millimeter, greater than 400 per square millimeter, greater than 500 per square millimeter, greater than 600 per square millimeter, greater than 700 per square millimeter, greater than 800 per square millimeter, or greater than 900 per square millimeter.

The plurality of retroreflective elements of the retroreflective multilayer film can be separated from one another by regular or irregular spacings on the retroreflective surface. For example, microprism retroreflective elements can be separated from one another by sets of parallel v-shaped grooves. The spacings between adjacent retroreflective elements can provide transparency to the retroreflective surface, permitting impinging light to penetrate to one or more lower layers of the multilayer film. In some embodiments, the transparent spacings account for a percentage of the area of the retroreflective surface ranging from 20% to 80%, e.g., from 20% to 56%, from 26% to 62%, from 32% to 68%, from 38% to 74%, or from 44% to 80%. In terms of upper limits, the transparent spacings can account for less than 80%, less than 74%, less than 68%, less than 62%, less than 56%, less than 50%, less than 44%, less than 38%, less than 32%, or less than 26% of the area of the retroreflective surface. In terms of lower limits, the transparent spacings can account for greater than 20%, greater than 26%, greater than 32%, greater than 38%, greater than 44%, greater than 50%, greater than 56%, greater than 62%, greater than 68%, or greater than 74% of the area of the retroreflective surface. Exemplary configurations of retroreflective elements within retroreflective articles can be found in U.S. Pat. Nos. 9,651,721 and 9,098,150, both of which are hereby incorporated by reference.

The piezoelectric layer comprises one or more materials demonstrating piezoelectricity or shape changing properties under stimulation, e.g., the application of a voltage. In general, the piezoelectric layer is configured such that piezoelectricity causes a liner change in a lengthwise dimension of the film, repositioning the retroreflective elements and modulating a retroreflected beam. The use of a piezoelectric material as an actuator or modulator in the multilayer film allows the modulating retroreflector to operate with low power requirements. The piezoelectric material can be selected to have transparency and/or flexibility when used in the multilayer construction. In some embodiments, the transparency and flexibility of the selected piezoelectric material can be greater than those of conventional piezoelectric materials such as ceramics or minerals. In some embodiments, the piezoelectric material comprises a polymer. In some embodiments, the piezoelectric material comprises a ferroelectric polymer. In some embodiments, the piezoelectric material comprises polyvinylidene fluoride (PVDF). PVDF is notable for its structural stability, mechanical toughness, impact resistance, and well-established robustness in terrestrial, maritime, and space applications. Suitable commercially available piezoelectric PVDF films include, for example, KF-2200, available from Kureha America (New York, N.Y.); and Piezotech FC, available from Piezotech (Pierre-Benite, France).

The response stimulation frequencies of the PVDF films can range from 20 MHz for thicker films (e.g., 20-50 microns) to more than 20 GHz for thinner films. The response frequency of the piezoelectric layer of the modulating retroreflective multilayer film can, for example, range from 20 MHz to 1.25 GHz, from 40 MHz to 2.5 GHz, from 80 MHz to 5 GHz, from 150 MHz to 10 GHz, or from 300 MHz to 20 GHz. In terms of upper limits, the response frequency of the piezoelectric layer can be less than 20 GHz, e.g, less than 10 GHz, less than 5 GHz, less than 2.5 GHz, less than 1.25 GHz, less than 600 MHz, less than 300 MHz, less than 150 MHz, less than 80 MHz, or less than 40 MHz. In terms of lower limits, the response frequency of the piezoelectric layer can be greater than 20 MHz, e.g, greater than 40 MHz, greater than 80 MHz, greater than 150 MHz, greater than 300 MHz, greater than 600 MHz, greater than 1.25 GHz, greater than 2.5 GHz, greater than 5 GHz, or greater than 10 GHz.

The electrodes in electrical connection with the top and bottom surfaces of the piezoelectric layer can be disposed within first and second electrode layers that each directly contact the piezoelectric layer. The first and second electrode layers can each directly contact one or more electrically conductive layers positioned between one or both of the electrode layers and the piezoelectric layer. The electrode layers can be configured to have transparency and/or flexibility when used in the multilayer construction. The electrodes can be constructed of a transparent material, or can be constructed of a nontransparent material configured in the form of a transparent conducting film with sufficient spacing between adjacent metallized components to allow the electrode layer to be sufficiently transparent. One or both of the electrode layers can comprise, for example, indium tin oxide (ITO), one or more other conductive oxides, one or more conductive polymers, e.g., poly(3,4 ethylenedioxthiophene) or poly(3,4 ethylenedioxthiophene) polystyrene sulfonate, metal grids, carbon nanotubes (CNTs), graphene, nanowire meshes, or one or more ultrathin metal films.

The modulating retroreflective multilayer film can include a processor that can be communicably connected to a voltage source, the first and second electrodes, and/or the photovoltaic system. The processor can be located within a layer of the multilayer film, and can be configured to store instructions for performing operations related to the function of the multilayer film. The operations can include, for example, receiving and/or analyzing electrical signals transmitted from the photovoltaic layer to the processor. The operations can further include applying a voltage across the piezoelectric layer. In some embodiments, the photovoltaic layer detects radiation and transmits related electrical signals related to the processor. One or both of the photovoltaic layer or the processor can be used to determine if the detected radiation corresponds with a preselected signature wavelength, frequency, or amplitude modulation indicative of an interrogation or communication signal being sent to the retroreflector. If the detected radiation corresponds with the preselected signature, then the process can activate the piezoelectric layer through the voltage application. The processor can also store information to be communicated by the multilayer film by controlling the modulation of retroreflected light. Such information can include, for example identification information such as a serial number.

In one embodiment, a smart device may be employed. The smart device is capable of running programs and displaying features on its screen. In some cases, the laser may be connected to the internet to provide the communications connection.

The modulating retroreflective multilayer film can include one or more energy storage devices, which can be electrically connected to the processor, voltage source, and/or the photovoltaic layer. The energy storage device can be configured to receive and store energy harvested or converted by the photovoltaic layer, and to supply energy to the processor or voltage source. The energy storage device can be located within a layer of the multilayer film. In some embodiments, the energy storage device comprises one or more batteries. In some embodiments, the energy storage device comprises one or more capacitors. The batteries or capacitors can be selected to be thin and/or flexible. The batteries can include, for example, thin and flexible lithium-polymer batteries. Suitable commercially available thin film batteries include, for example, BV-452229-14ET, available from BrightVolt (Redmond, Wash.). The capacitors can include, for example, activated carbon, paper or polymer separators, electrolyte, aluminum or other metal foil, or any combination thereof. Suitable commercially available thin film capacitors include, for example, PRO200F02R1-045W050L-S, available from PBC Tech (Troy, N.Y.). Suitable energy storage devices other than batteries and capacitors are contemplated.

The layers (and components) described above can located directly adjacent to, and in contact with, one another in a stacked configuration, or there can be one or more intervening layers located between the described layers. For example, the multilayer film can include one or more adhesive layers. Each adhesive layers can be configured to bond different layers to one another, or can positioned at an end of the multilayer film so as to be configured to bond the multilayer film assembly to an external exposed surface. Each adhesive layer can include one or more sublayers with different adhesive compositions or properties, and can include, for example, one or more pressure sensitive adhesives.

The present invention also relates to labels that include the modulating retroreflective multilayer film. The labels include a multilayer film as described above, wherein the multilayer layer film includes one or more adhesive layers, and one of the one or more adhesive layers is an outer adhesive layer located at an end of the multilayer film. In some embodiments, the label further includes a release liner disposed on the outer adhesive layer. The releasable liner can function as a protective cover such that the release liner remains in place until the label is ready for attachment to an object or surface. If a liner or release liner is included in the label, a wide array of materials and configurations can be used for the liner. In many embodiments, the liner is a paper or paper-based material. In many other embodiments, the liner is a polymeric film of one or more polymeric materials. Typically, at least one face of the liner is coated with a release material such as a silicone or silicone-based material. As will be appreciated, the release coated face of the liner is placed in contact with the otherwise exposed face of the outer adhesive layer. Prior to application of the label to a surface of interest, the liner is removed to thereby expose the adhesive face of the label. The liner can be in the form of a single sheet. Alternatively, the liner can be in the form of multiple sections or panels.

The present invention also relates to labeled articles that include a label. The labeled articles include a label as described above and an article comprising an exposed surface. Because of the beneficial flexible properties of the modulating retroreflective multilayer film, the exposed surface of the article can have a wide variety of shapes and smoothness. For example, the exposed surface can be planar, nonplanar, curved, angular, or irregular. The exposed surface can be smooth, rough, or disjointed, and can have any number or protrusions or depressions. Because of the beneficial low-power and power generating properties of the modulating retroreflective multilayer film, the article can be in a remote or inaccessible location. Because of the relatively simplicity of the construction of the modulating retroreflective multilayer film, the labels can easily be mass produced and customized to be used in creating large numbers of varied labeled articles.

Figure 6:
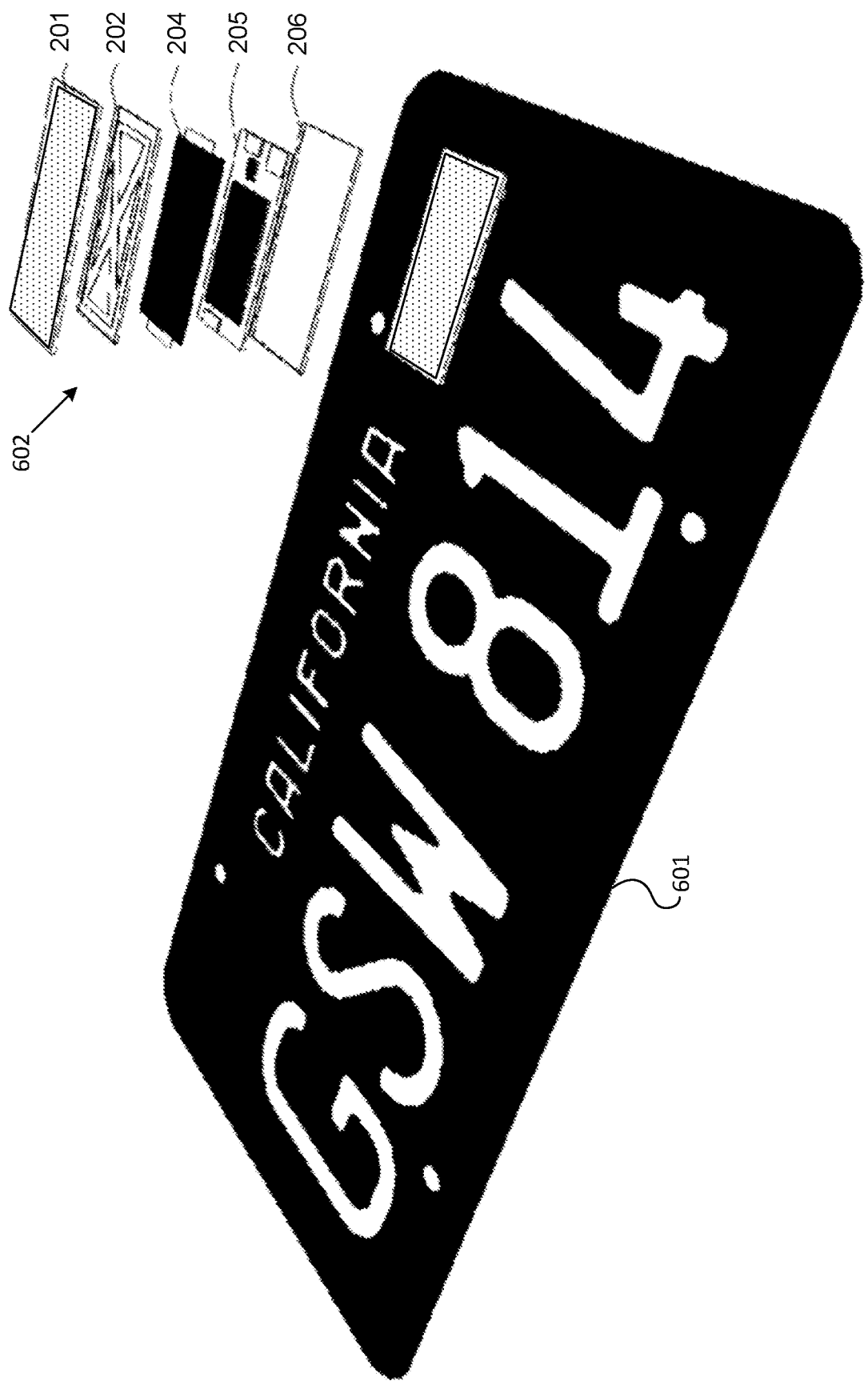
FIG. 6 illustrates a modulating retroreflective multilayer film in accordance with an embodiment in the form of an adhesive label adhered to a license plate.

FIG. 6 illustrates a specific example of a labeled article embodiment in the form of a labeled license plate. The illustration shows a license plate 601 having an exposed surface to which a modulating retroreflective multilayer film (shown in exploded view 602) is adhered. The multilayer film can be, for example, the multilayer film 200 of FIG. 2. License plate labels or tags can contain vehicle-specific information that could be cross-referenced with various governmental or law enforcement databases. The labels can, for example, have dimensions on the order of 20 mm by 40 mm by 1.5 mm. The labels can be applied to existing vehicle license plates by the owner who exposes the pressure sensitive backing and adheres the label to the vehicle's plate. In some embodiments, light from the sun, headlights, and other ambient sources can be used by the photovoltaic layer of the multilayer film to generate power for the retroreflector. Laser scanners at toll areas, on police cars, at smog stations, etc., could be used to communicate with the multilayer film and acquire the vehicle's data for assessment from the federal, state, or municipal infrastructure.

Figure 7:
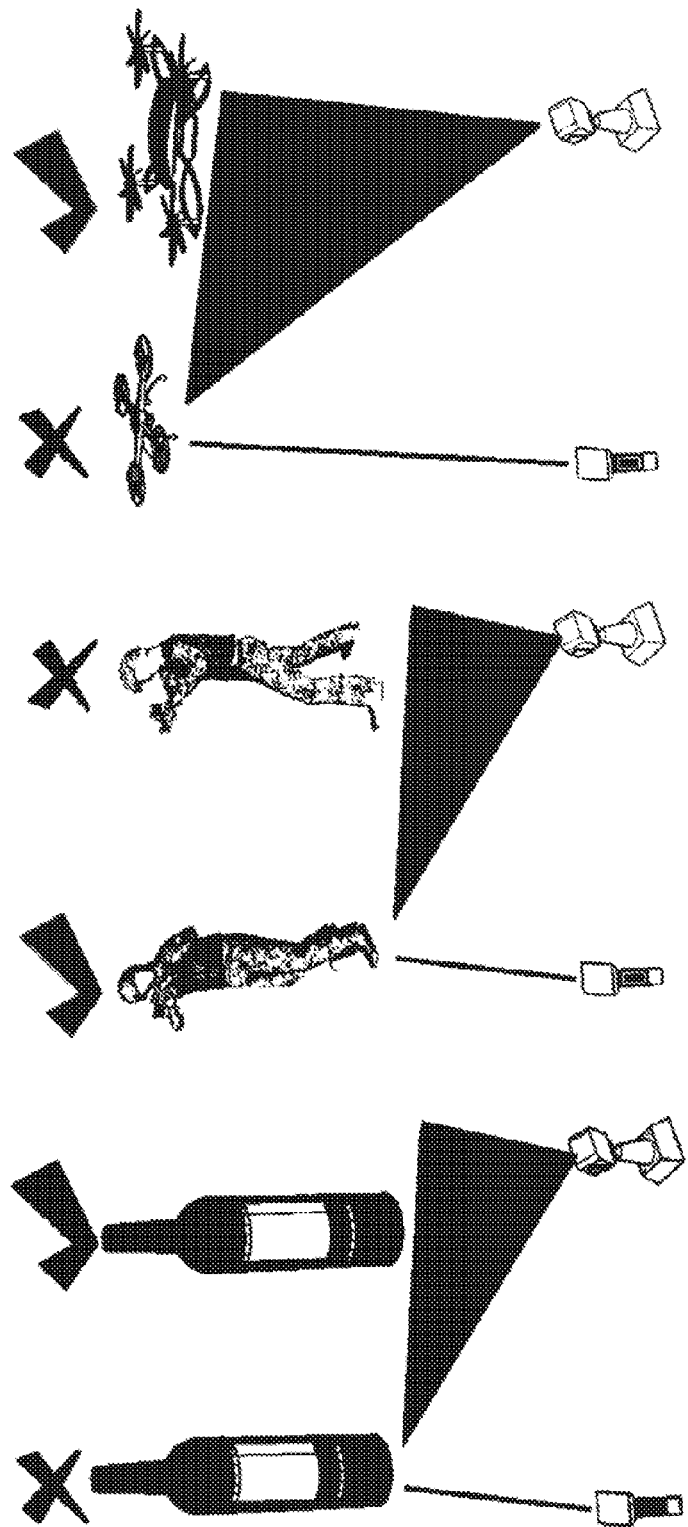
FIG. 7A illustrates an application of the provided modulating retroreflective piezoelectric multilayer films as labels used to distinguish different types of bottles.
FIG. 7B illustrates an application of the provided modulating retroreflective piezoelectric multilayer films as labels used to distinguish different types of uniformed military or law enforcement personnel.
FIG. 7C illustrates an application of the provided modulating retroreflective piezoelectric multilayer films as labels used to distinguish different types of aerial drones.

FIGS. 7A-7C illustrate further applications of labels and labeled articles in accordance with provided embodiments. As shown in the illustrations, the provided labels can be used to identify and differentiate beverage bottles (FIG. 7A) or other commercial products, uniformed military or law enforcement officers (FIG. 7B), or commercial or private aerial drones (FIG. 7C). In particular, the provided labels can be used as shown in FIG. 7B to communicate an "identify friend or foe" (IFF) response for use in military situations, for example, where the multilayer film can respond to an incident optical beam to prevent friendly fire incidents.

Figure 8:
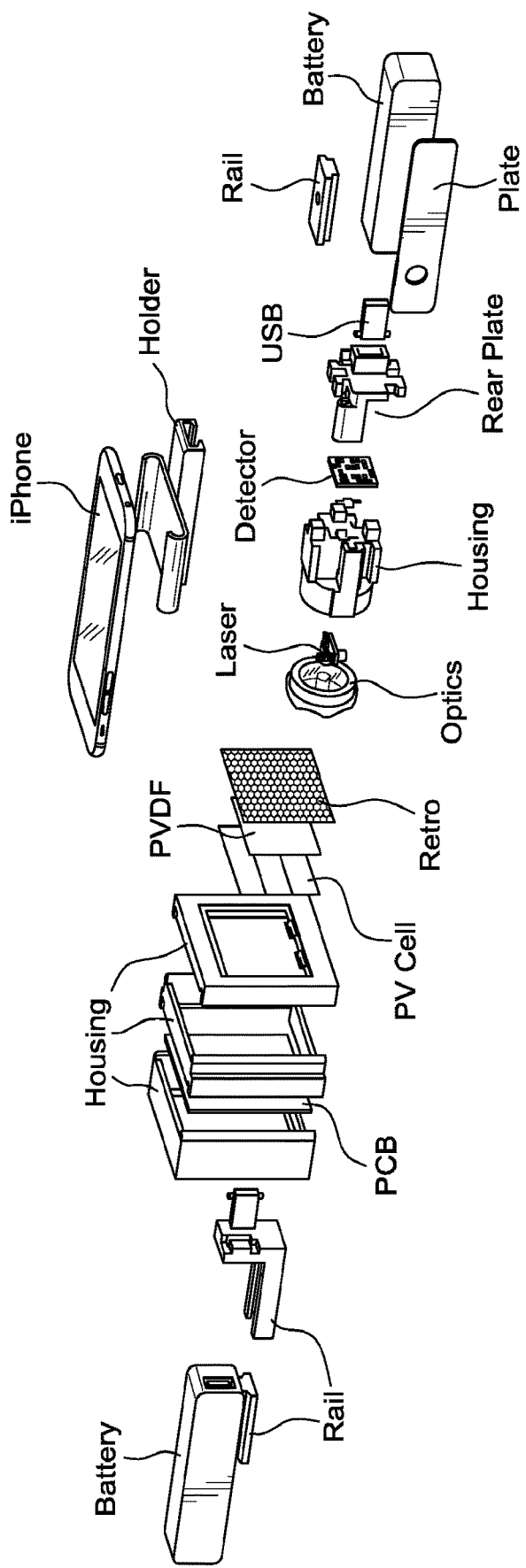
FIG. 8 illustrates a modulating retroreflective multilayer film in accordance with an embodiment in the form of a device enclosed in a housing.

FIG. 8 illustrates an example of a tag that includes a multilayer film, wherein the multilayer film is enclosed within a housing. Shown in the exploded view are a retroreflector layer, a piezoelectric layer (PVDF), and a photovoltaic layer (PV), each substantially coextensive in shape and size, and each positioned in a multilayer stacked configuration. Also shown is a housing that can enclose the multiple layers, along with a printed circuit board (PCB) that can include the electronic components discussed above, such as a processor. The multilayer film tag can be interrogated by a beam emitted from a handheld device, the components of which are shown in exploded view in the right half of FIG. 7.

The present invention also relates to (miniature) spacecraft that include a modulating retroreflective multilayer film. The spacecraft include a multilayer film as described above, two or more polymer tubes, and one or more shape-memory alloy wires. Each of the one or more shape-memory alloy wires is connected to two or more of the polymer tubes. In some embodiments, the polymer tubes and/or the shape-memory alloy wires can be independently located within one or more layers of the multilayer film. Because the multilayer film is constructed of lightweight and flexible material, the retroreflective multilayer film can be configured as a foldable sail for the spacecraft, wherein the sail functions as a communication means for the spacecraft, and can also function as a low power propulsion means as well. The self-aligning nature of the retroreflector can allow it to be used for the propulsive reflection of high energy radiation to achieve flight and control attitude for miniaturized spacecraft or star ships. The particular construction and composition of the multilayer film can allow radiation energy to pass through the film, rather than being absorbed by the film and building up destructive heat within it. The flexibility and thin dimensions of the film can allow it to be folded for storage and delivery, reducing the transportation volume needed for deployment. The folded configuration also permits mechanical energy to be stored and later used to unfold and impart initial spin on the spacecraft. In some embodiments, the spacecraft have a low mass-to-surface area ratio. For example the mass-to-surface area ratio, as calculated by comparing the total weight of the spacecraft to the surface area thereof, may be less than 1 $g/m^2$, e.g., less than 0.5 $g/m^2$, less than 0.34 $g/m^2$, less than 0.3 $g/m^2$, less than 0.2 $g/m^2$, or less than 0.1 $g/m^2$. In terms of ranges, the mass-to-surface area ratio may range from 0.01 $g/m^2$ to 1 $g/m^2$, e.g., from 0.05 $g/m^2$ to 0.5 $g/m^2$, from 0.05 $g/m^2$ to 0.34 $g/m^2$, or from 0.1 $g/m^2$ to 0.3 $g/m^2$. The low mass-to-surface area ratio beneficially provides for improved acceleration of the spacecraft to high velocities, e.g., on the order of magnitude of the speed of light, which enables improvements in transit time to planets. In contrast, conventional chemically-propelled spacecraft are only capable of much slower acceleration and velocity. For example, the spacecraft described herein is capable of a transit time to a planet of days or weeks, while conventional chemically-propelled spacecraft are capable of a transit time to a planet of multiple years, e.g., hundreds or thousands of years.

Figure 9A:
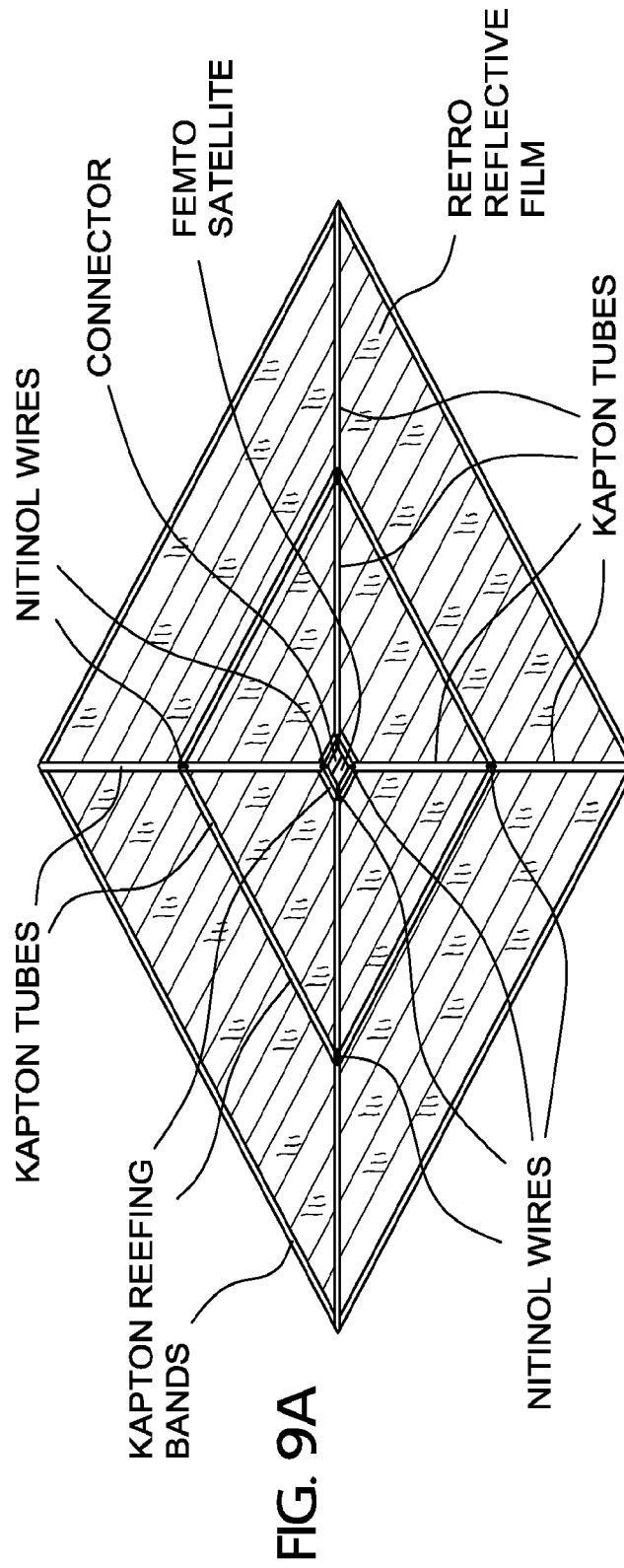
FIG. 9A presents an isometric view of a miniaturized spacecraft in accordance with an embodiment in which the retroreflective multilayer film includes support tubes and shape-memory wires.
Figure 9B:
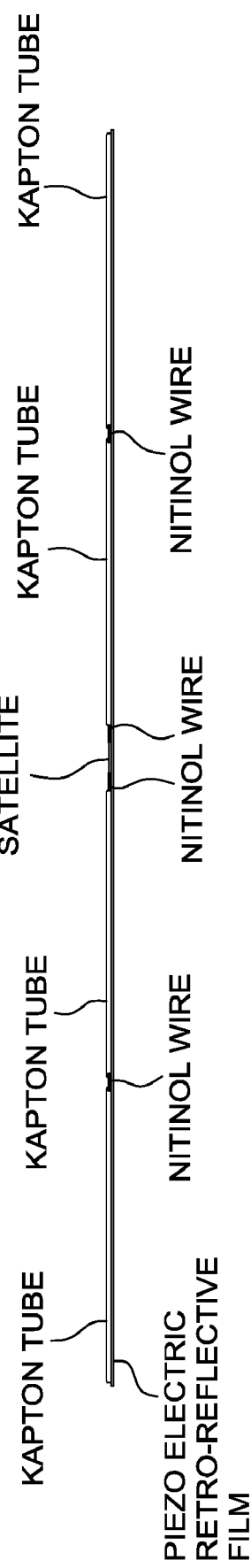
FIG. 9B presents a side view of the miniaturized spacecraft of FIG. 9A.

FIGS. 9A and 9B illustrate an isometric view and side view, respectively, of an exemplary spacecraft including the modulating retroreflective multilayer film. The device is constructed with a large surface of retroreflective multilayer film that is 1-9 microns thick. The film is held in tension by KYNAR® tubes with NITINOL® wires. Reefing bands reinforce the film from tearing and keep tension. A femto satellite having a mass on the order of a few grams is electronically and mechanically connected to the film and nitinol wires. The femto satellite can be capable of providing computer services, power, attitude determination, and control and radio communications. The functions of the satellite can be limited by the fact that it carries and harvests little power by itself. For example, femto satellites typically have less than 50 milliwatts of signal transmission power available. Thus, if this were the primary means of signal transmission for the spacecraft, then the communication range would be limited to several hundred miles unless extraordinary means were used to receive signals. In contrast, by including the modulating retroreflective multilayer film, the spacecraft becomes capable of retroreflecting a very high wattage of signal energy, and communicating over a much larger distance.

Figure 10A:
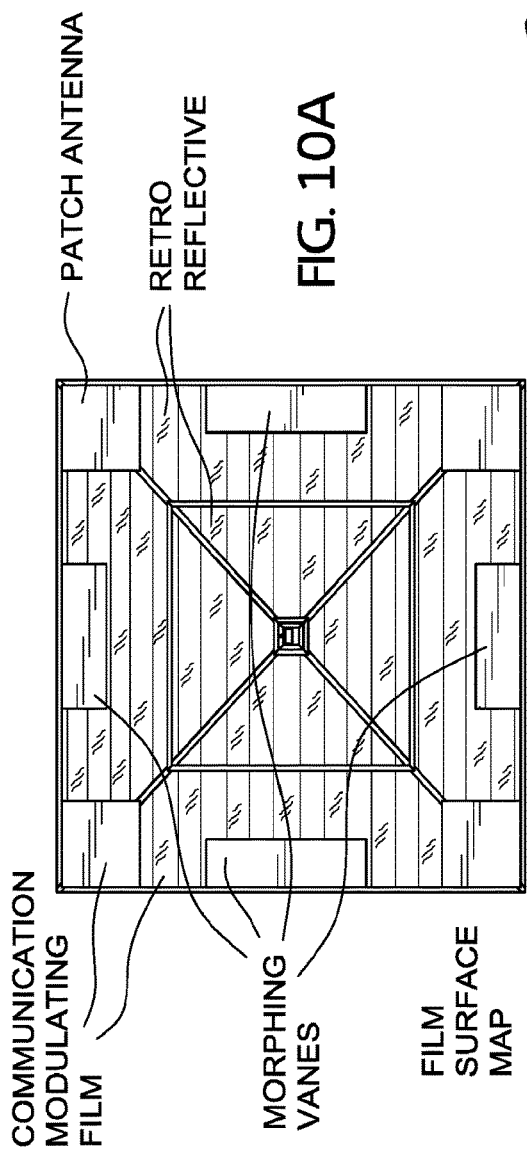
FIG. 10A presents a top view of a miniaturized spacecraft in accordance with an embodiment having sub-regions for signal modulation and antennas.
Figure 10B:
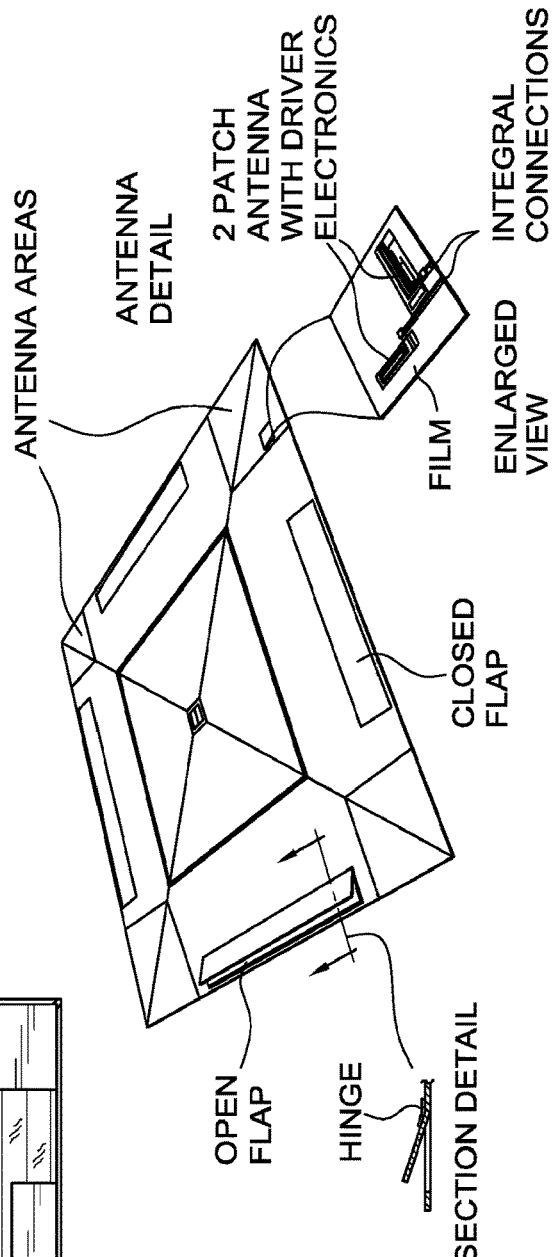
FIG. 10B presents an isometric view of the miniaturized spacecraft of FIG. 10A.

FIGS. 10A and 10B illustrate a top view and isometric view, respectively, of a spacecraft having sub-regions for signal modulation and antennas. The flaps shown in the illustrations can be used for changing the attitude orientation and direction of the device when illuminated by natural or man-made radiation. Voltage applied to the flaps shown in the illustrations can cause the film to pivot around hinges, resulting in a mechanical distortion. For example, a non-PVDF film can be laminated to a designated hinge area. When voltage is applied to this region, differential elongation of the PVDF and non-PVDF films result in a mechanical deflection. This deflection alters the reflective properties of the film, causing the device's course to be altered. The femto satellite can be connected to the specific region of the film, and can control the position of the flaps in accordance with its attitude to affect navigation and communications.

Also shown are multiple integrated patch antennas that can be used for transmission and reception of signals in normal, differential, and phased modes. Typically, the antennas operate as receivers, as the device has low power budgets for long distance transmissions. The patch antennas can be printed in the electrode material with provision for low noise amplifiers (LNAs), phase array beam forming switches, and driver electronics as integral parts of the film. Patch antenna construction can be in a manner that resonates specific selected frequencies, and can operate with Global Positioning System (GPS) and BLUETOOTH® signals. The device typically uses a software-defined radio (SDR) to receive signals.

FIGS. 11A and 11B illustrate the construction and environment of a ground or base station used to identify and monitor the position of the miniaturized spacecraft. From FIG. 11A, a laser projects a beam that is bore sighted to a telescope. Reflected energy is collected by the telescope primary mirror and relayed to the objective lens by the secondary mirror. A photo diode of the telescope receives the energy, which is then amplified and relayed to a computer for analysis and display. From FIG. 11B, the remote spacecraft device can be oriented in a random angle relative to the ground laser and receiver. With the laser operating and the receiver open to reflected data, the base station assembly is systematically directed by a tracking mechanism to scan the environment.

Figure 12:
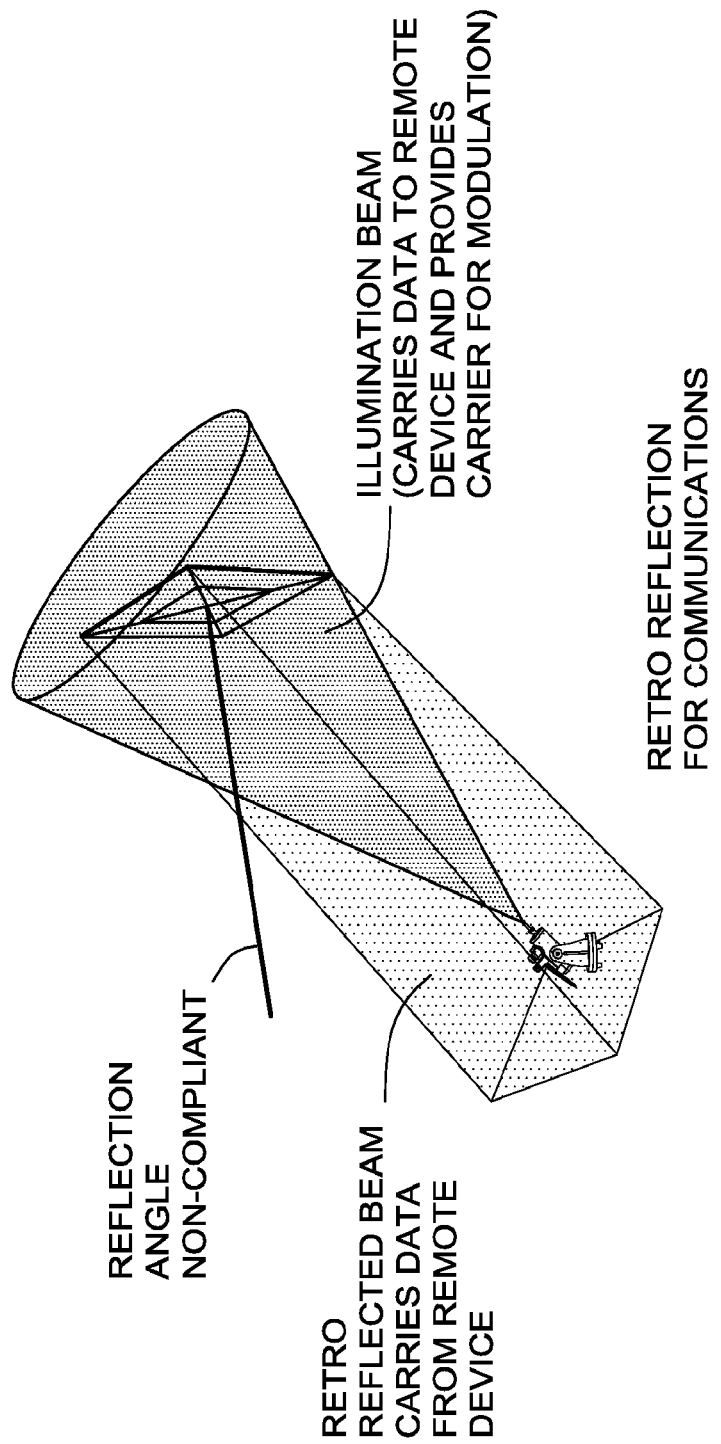
FIG. 12 illustrates the locate and communicate operations of the ground station of FIG. 11A.

FIG. 12 illustrates the "locate" and "communicate" operations of the ground station of FIGS. 11A and 11B. As shown in the illustration, in this mode the laser and receiver are swept across the anticipated environment by the scanning mechanism. The laser emits radiation while the receiver monitors for a reflection. The remote spacecraft device modulates the film with a unique code identifying itself. When the beam sweeps across the device's modulating film the retroreflection beam is therefore coded with data that is recognizable by the receiver. Upon recognition of the desired coded identifying signal, the located device transitions from discovery mode to a communications mode, and the laser and receiver are directed towards the identified location by the scanning mechanism. These locating operations are consistent with Light Detection and Ranging (LIDAR) methods, and would be compatible with other LIDAR devices. Also, in this mode the remote spacecraft device can not only be discovered but can also be labeled with its location. In this way, the remote spacecraft device, once identified and located, could serve as an landmark for further navigational purposes. Furthermore, because the reflection angle from the remote spacecraft device is non-compliant with the retroreflected return, detection and closing of the link between the base station and remote device is made considerable easier. This is because otherwise the remote device would constantly have to adjust and maintain alignment with the laser and telescope.

Figure 13:
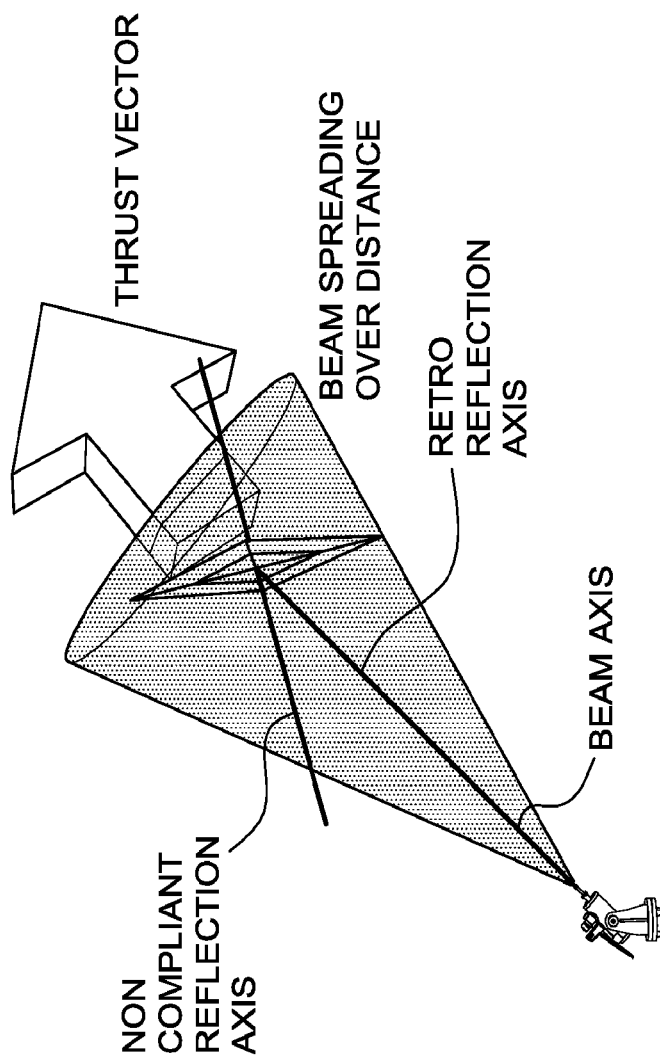
FIG. 13 illustrates the propulsion operation of the ground station of FIG. 11A.

FIG. 13 illustrates the propulsion operations of the ground station of FIGS. 11A and 11B. As shown in the illustration, the retroreflective multilayer film of the miniaturized spacecraft can be illuminated by extremely light levels of laser radiation emitted from the ground station. In some embodiments, energy ranging from the order of a few megawatts to 100 gigawatts can be used to accelerate the remote device to speeds approaching a significant fraction of the speed of light. The operations are useful for propulsion of the device at a non-compliant device angle, enabling the device to accelerate along the beam axis, unaffected by the reflection axis. Because of this, it can be critical to stay within the beam's axis to stay on course and derive the maximum velocity afforded by the radiation's pressure. In such cases, as the retroreflectors keep the beam on axis regardless of the orientation of the multilayer film, maximum thrust would be realized. Additionally, the high surface density of the retroreflective elements of the multilayer film can ensure that the film provides uniform performance.

FIGS. 14A-14D illustrate a host deployment craft used to launch the provided miniaturized spacecraft. FIG. 14A illustrates a closed position of a host craft that can, for example, store sixteen folded miniaturized spacecraft devices to be deployed. In FIG. 14B, the panels of the host craft are opened, and a spacecraft device with folded retroreflective multilayer film is pushed from the host craft. A spacer pops off and is used to maintain a gap between the end of the host craft and the first device. Subsequent launched spacecraft devices use the spacer to provide a gap between their neighboring devices. In FIG. 14C, as the device leaves the host craft, the stored mechanical energy of the shape-memory alloy wire motor cause the polymer tubes (e.g., KAPTON® tubes) to unfurl the multilayer film. In FIG. 14D, the multilayer film of the miniaturized spacecraft reaches it deployed state as a substantially flat film.

Alternative and analogous embodiments involving marine, submarine, automotive, and airborne applications are also envisioned and made practical through the beneficial properties of the modulating retroreflective multilayer film. For example, with minor modifications the multilayer film could be configured to float on the surface of an ocean and to relay information from submarines to airborne assets. Labels, tags, and other devices using the provided multilayer film could also be used, for example, in the fields of transportation, logistics, navigation, and remote sensing. The communication functions of the device could also allow it to serve as an internet access point with an internet connected base station located some distance away.

The following embodiments are contemplated. All combinations of features and embodiment are contemplated.

Embodiment 1: A modulating retroreflective multilayer film comprising: retroreflective elements; a piezoelectric layer having opposing top and bottom surfaces; a first electrode layer in electrical connection with the top surface of the piezoelectric layer; a second electrode layer in electrical connection with the bottom surface of the piezoelectric layer; a voltage source located within a layer of the multilayer film and being in electrical connection with the first and second electrode layers; a processor located within a layer of the multilayer film and being communicably coupled with the voltage source to apply a voltage across the piezoelectric layer; an energy storage device located within a layer of the multilayer film and being configured to store energy used for the applying of the voltage; and a photovoltaic layer communicably in electrical connection with the energy storage device and coupled with the processor to transmit electrical signals to the processor.

Embodiment 2: An embodiment of embodiment 1, wherein the retroreflective elements are disposed on the top surface or the bottom surface of the piezoelectric layer.

Embodiment 3: An embodiment of embodiment 1, further comprising: a retroreflective layer comprising at least some of the retroreflective elements.

Embodiment 4: An embodiment of any of the embodiments of embodiments 1-3, wherein the piezoelectric layer and the photovoltaic layer are substantially coextensive with one another.

Embodiment 5: An embodiment of any of the embodiments of embodiments 1-4, wherein at least a portion of each of the piezoelectric layer, the first electrode layer, and the second electrode layer is transparent.

Embodiment 6: An embodiment of any of the embodiments of embodiments 1-5, wherein the energy storage device is in communication with the processor to provide power to the processor.

Embodiment 7: An embodiment of any of the embodiments of embodiments 1-6, wherein the photovoltaic layer is configured to harvest energy to be stored in the energy storage device.

Embodiment 8: An embodiment of any of the embodiments of embodiments 1-7, wherein the energy storage device comprises a battery.

Embodiment 9: An embodiment of any of the embodiments of embodiments 1-7, wherein the energy storage device comprises a capacitor.

Embodiment 10: An embodiment of any of the embodiments of embodiments 1-9, wherein the retroreflective elements comprise microprism retroreflectors.

Embodiment 11: An embodiment of any of the embodiments of embodiments 1-9, wherein the retroreflective elements comprise holographic retroreflectors.

Embodiment 12: An embodiment of any of the embodiments of embodiments 1-11, wherein the retroreflective elements are disposed on a retroreflective surface at a density of greater than 10 per square millimeter.

Embodiment 13: An embodiment of any of the embodiments of embodiments 1-12, wherein the piezoelectric layer comprises polyvinylidene fluoride.

Embodiment 14: An embodiment of any of the embodiments of embodiments 1-13, having a durometer hardness of less than 50.

Embodiment 15: An embodiment of any of the embodiments of embodiments 1-14, further comprising: one or more adhesive layers.

Embodiment 16: An embodiment of any of the embodiments of embodiments 1-15, having a thickness of less than 100 microns.

Embodiment 17: A label comprising: a multilayer film of embodiment 15, wherein one of the one or more adhesive layers is an outer adhesive layer located at an end of the multilayer film.

Embodiment 18: An embodiment of embodiment 17, further comprising: a release liner disposed on the outer adhesive layer.

Embodiment 19: A labeled article comprising: an article comprising an exposed surface; a label of embodiment 17 or 18 adhered to the exposed surface of the article.

Embodiment 20: An embodiment of embodiment 19, wherein the exposed surface is nonplanar.

Embodiment 21: A miniature spacecraft comprising: a multilayer film of any of the embodiments of embodiment 1-16; two or more polymer tubes located within one or more layers of the multilayer film; and one or more shape-memory alloy wires located within one or more layers of the multilayer film, wherein each of the one or more shape-memory alloy wires is connected to two or more of the polymer tubes.

Embodiment 22: An embodiment of embodiment 21, wherein the two or more polymer tubes comprise PVDF or poly(4,4'-oxydiphenylene-pyromellitimide).

Embodiment 23: An embodiment of embodiment 21 or 22, wherein the one or more shape-memory alloy wires comprise nickel titanium.

Embodiment 24: An embodiment of any of the embodiments of embodiments 22-23, further comprising: a femto satellite.

Embodiment 25: A method for modulating retroreflected light, the method comprising: providing a multilayer film of an embodiment of any of the embodiments of embodiment 1-16; illuminating the film with an incident light beam; retroreflecting the incident light beam into a reflected light beam via a first configuration of the retroreflective elements; detecting the incident light beam with the photovoltaic layer; transmitting a signal from the photovoltaic layer to the processor; applying a voltage across the piezoelectric layer to change a dimension of the piezoelectric layer to form a second configuration of the retroreflective elements; and retroreflecting the incident light beam into a modulated light beam via the second configuration of the retroreflective elements.

Embodiment 26: An embodiment of embodiment 25, further comprising: harvesting energy to be stored in the energy storage device with the photovoltaic layer.

Embodiment 27: An embodiment of embodiment 25 or 26, wherein the voltage is applied with a power of less than 1 nanowatt.

Embodiment 28: A method of applying a label to an article, the method comprising: providing an article comprising an exposed surface; providing a label of embodiment 17 or 18; and adhering the label to the exposed surface of the article, thereby applying the label to the article.

Embodiment 29: An embodiment of embodiment 28, wherein the exposed surface of the article is nonplanar While the invention has been described in detail, modifications within the spirit and scope of the invention will be readily apparent to those of skill in the art. In view of the foregoing discussion, relevant knowledge in the art and references discussed above in connection with the Background and Detailed Description, the disclosures of which are all incorporated herein by reference. In addition, it should be understood that aspects of the invention and portions of various embodiments and various features recited above and/or in the appended claims may be combined or interchanged either in whole or in part. In the foregoing descriptions of the various embodiments, those embodiments which refer to another embodiment may be appropriately combined with other embodiments as will be appreciated by one of skill in the art. Furthermore, those of ordinary skill in the art will appreciate that the foregoing description is by way of example only, and is not intended to limit the invention.

We claim:

1. A modulating retroreflective multilayer film comprising:
   retroreflective elements;
   a piezoelectric layer having opposing top and bottom surfaces;
   a first electrode layer in electrical connection with the top surface of the piezoelectric layer;
   a second electrode layer in electrical connection with the bottom surface of the piezoelectric layer;
   a voltage source located within a layer of the multilayer film and being in electrical connection with the first and second electrode layers;
   a processor located within a layer of the multilayer film and being communicably coupled with the voltage source to apply a voltage across the piezoelectric layer;
   an energy storage device located within a layer of the multilayer film and being configured to store energy used for the applying of the voltage; and
   a photovoltaic layer communicably in electrical connection with the energy storage device and coupled with the processor to transmit electrical signals to the processor;
   wherein the piezoelectric layer and the photovoltaic layer are substantially coextensive with one another.

2. The multilayer film of claim 1, wherein the retroreflective elements are disposed on the top surface or the bottom surface of the piezoelectric layer.

3. The multilayer film of claim 1, further comprising:
   a retroreflective layer comprising at least some of the retroreflective elements.

4. The multilayer film of claim 1, wherein at least a portion of each of the piezoelectric layer, the first electrode layer, and the second electrode layer is transparent.

5. The multilayer film of claim 1, wherein the energy storage device is in communication with the processor to provide power to the processor.

6. The multilayer film of claim 1, wherein the photovoltaic layer is configured to harvest energy to be stored in the energy storage device.

7. The multilayer film of claim 1, wherein the energy storage device comprises a battery or a capacitor.

8. The multilayer film of claim 1, wherein the retroreflective elements comprise microprism retroreflectors or holographic retroreflectors.

9. The multilayer film of claim 1, wherein the retroreflective elements are disposed on a retroreflective surface at a density of greater than 10 per square millimeter.

10. The multilayer film of claim 1, wherein the piezoelectric layer comprises polyvinylidene fluoride.

11. The multilayer film of claim 1, having a durometer hardness of less than 50.

12. The multilayer film of claim 1, having a thickness of less than 100 microns.

13. A label comprising:
   a modulating retroreflective multilayer film comprising:
      retroreflective elements;
      a piezoelectric layer having opposing top and bottom surfaces;
      a first electrode layer in electrical connection with the top surface of the piezoelectric layer;
      a second electrode layer in electrical connection with the bottom surface of the piezoelectric layer;
      a voltage source located within a layer of the multilayer film and being in electrical connection with the first and second electrode layers;
      a processor located within a layer of the multilayer film and being communicably coupled with the voltage source to apply a voltage across the piezoelectric layer;
      an energy storage device located within a layer of the multilayer film and being configured to store energy used for the applying of the voltage; and a photovoltaic layer communicably in electrical connection with the energy storage device and coupled with the processor to transmit electrical signals to the processor; and one or more adhesive layers, wherein one of the one or more adhesive layers is an outer adhesive layer located at an end of the multilayer film.

14. The label of claim 13, further comprising:
a release liner disposed on the outer adhesive layer.

15. A method for modulating retroreflected light, the method comprising:

providing a modulating retroreflective multilayer film comprising:

retroreflective elements;

a piezoelectric layer having opposing top and bottom surfaces;

a first electrode layer in electrical connection with the top surface of the piezoelectric layer;

a second electrode layer in electrical connection with the bottom surface of the piezoelectric layer;

a voltage source located within a layer of the multilayer film and being in electrical connection with the first and second electrode layers;

a processor located within a layer of the multilayer film and being communicably coupled with the voltage source to apply a voltage across the piezoelectric layer;

an energy storage device located within a layer of the multilayer film and being configured to store energy used for the applying of the voltage; and a photovoltaic layer communicably in electrical connection with the energy storage device and coupled with the processor to transmit electrical signals to the processor illuminating the film with an incident light beam;

retroreflecting the incident light beam into a reflected light beam via a first configuration of retroreflective elements;

detecting the incident light beam with the photovoltaic layer;

transmitting a signal from the photovoltaic layer to the processor;

applying a voltage across the piezoelectric layer to change a dimension of the piezoelectric layer to form a second configuration of retroreflective elements; and retroreflecting the incident light beam into a modulated light beam via the second configuration of retroreflective elements.

16. The method of claim 15, further comprising:
harvesting energy to be stored in the energy storage device with the photovoltaic layer.

17. The method of claim 15, wherein the voltage is applied with a power of less than 1 nanowatt.

* * * * *